(12) United States Patent
Zhang et al.

(10) Patent No.: US 12,336,141 B1
(45) Date of Patent: Jun. 17, 2025

(54) COLD PLATE CAVITY DESIGNS FOR IMPROVED THERMAL PERFORMANCE

(71) Applicant: Adeia Semiconductor Bonding Technologies Inc., San Jose, CA (US)

(72) Inventors: Ron Zhang, Sunnyvale, CA (US); Belgacem Haba, Saratoga, CA (US); Gaius Gillman Fountain, Jr., Youngsville, NC (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 0 days.

(21) Appl. No.: 18/750,952

(22) Filed: Jun. 21, 2024

Related U.S. Application Data

(60) Provisional application No. 63/651,799, filed on May 24, 2024, provisional application No. 63/572,054, filed on Mar. 29, 2024.

(51) Int. Cl.
*H05K 7/20* (2006.01)

(52) U.S. Cl.
CPC ..... *H05K 7/20272* (2013.01); *H05K 7/20254* (2013.01)

(58) Field of Classification Search
CPC .......... H05K 7/20254; H05K 7/20272; H05K 7/20218; H05K 7/20872; H05K 7/20763; H01L 23/4735; H01L 23/367; H01L 23/3675

See application file for complete search history.

(56) References Cited

U.S. PATENT DOCUMENTS

| | | | |
|---|---|---|---|
| 4,274,479 A | 6/1981 | Eastman | |
| 5,309,986 A | 5/1994 | Itoh | |
| 5,436,501 A * | 7/1995 | Ikeda | H01L 23/4735 165/80.4 |
| 5,522,452 A | 6/1996 | Mizuno et al. | |

(Continued)

FOREIGN PATENT DOCUMENTS

| | | |
|---|---|---|
| CN | 109524373 A | 3/2019 |
| CN | 111128976 A | 5/2020 |

(Continued)

OTHER PUBLICATIONS

Evan G. Colgan, "A Practical Implementation Of Silicon Microchannel Coolers", available online at <https://www.electronics-cooling.com/2007/11/a-practical-implementation-of-silicon-microchannel-coolers/>, Nov. 1, 2007, 10 pages.

(Continued)

*Primary Examiner* — Adam B Dravininkas
(74) *Attorney, Agent, or Firm* — Haley Guiliano LLP

(57) ABSTRACT

A device package comprising an integrated cooling assembly. The integrated cooling assembly comprises a semiconductor device and a cold plate attached to the semiconductor device. The cold plate comprises a first side, a second side vertically adjacent to the first side, a first inlet, a first cavity, and a first outlet. The first side of the cold plate comprises a first region, a second region, and a third region, wherein the second region is between the first region and the third region. In some embodiments, the semiconductor device is attached to the first region of the cold plate and the third region of the cold plate, and the first cavity extends along the second region of the cold plate.

17 Claims, 13 Drawing Sheets

(56) References Cited

U.S. PATENT DOCUMENTS

| | | | |
|---|---|---|---|
| 5,769,154 A | | 6/1998 | Adkins et al. |
| 6,056,044 A | | 5/2000 | Benson et al. |
| 6,351,384 B1 | * | 2/2002 | Daikoku ............... F28F 13/12 |
| | | | 361/689 |
| 6,686,532 B1 | | 2/2004 | Macris |
| 6,822,326 B2 | | 11/2004 | Enquist et al. |
| 7,190,581 B1 | * | 3/2007 | Hassani ............. H01L 23/3677 |
| | | | 361/698 |
| 7,289,326 B2 | | 10/2007 | Heydari et al. |
| 7,485,957 B2 | | 2/2009 | Brandenburg et al. |
| 7,511,372 B2 | | 3/2009 | Chiu |
| 7,523,617 B2 | | 4/2009 | Venkatasubramanian et al. |
| 7,622,324 B2 | | 11/2009 | Enquist et al. |
| 7,692,926 B2 | | 4/2010 | Henderson et al. |
| 7,957,137 B2 | | 6/2011 | Prasher |
| 7,978,473 B2 | | 7/2011 | Campbell et al. |
| 7,997,087 B2 | | 8/2011 | Venkatasubramanian et al. |
| 8,164,169 B2 | | 4/2012 | Chrysler et al. |
| 8,630,091 B2 | | 1/2014 | Ward et al. |
| 9,224,673 B2 | | 12/2015 | Chen et al. |
| 9,299,641 B2 | | 3/2016 | Sekar et al. |
| 9,355,932 B2 | | 5/2016 | Ankireddi et al. |
| 9,391,143 B2 | | 7/2016 | Tong et al. |
| 9,553,071 B1 | | 1/2017 | Haba |
| 9,741,638 B2 | | 8/2017 | Hsieh et al. |
| 9,741,696 B2 | | 8/2017 | Katkar et al. |
| 9,746,248 B2 | | 8/2017 | Semenov et al. |
| 9,768,149 B2 | | 9/2017 | Vadhavkar et al. |
| 9,818,723 B2 | | 11/2017 | Haba |
| 10,032,695 B2 | | 7/2018 | Iyengar et al. |
| 10,083,934 B2 | | 9/2018 | Haba |
| 10,157,818 B2 | | 12/2018 | Chen et al. |
| 10,170,392 B2 | | 1/2019 | Chainer et al. |
| 10,199,356 B2 | | 2/2019 | Kinsley |
| 10,312,221 B1 | | 6/2019 | Agarwal et al. |
| 10,332,823 B2 | | 6/2019 | Chen et al. |
| 10,461,059 B2 | | 10/2019 | Koopmans et al. |
| 10,694,641 B2 | | 6/2020 | Basu et al. |
| 10,978,427 B2 | | 4/2021 | Li et al. |
| 11,187,469 B2 | | 11/2021 | Karesh |
| 11,387,164 B2 | | 7/2022 | Wu et al. |
| 11,598,594 B2 | | 3/2023 | Lewis et al. |
| 11,996,351 B2 | | 5/2024 | Hsiao et al. |
| 2002/0096508 A1 | * | 7/2002 | Weaver ............. H01L 21/67103 |
| | | | 219/468.1 |
| 2003/0157782 A1 | | 8/2003 | Kellar et al. |
| 2004/0184237 A1 | | 9/2004 | Chang |
| 2004/0251530 A1 | | 12/2004 | Yamaji |
| 2005/0126766 A1 | | 6/2005 | Lee et al. |
| 2005/0213301 A1 | | 9/2005 | Prasher |
| 2006/0042825 A1 | | 3/2006 | Lu et al. |
| 2006/0103011 A1 | | 5/2006 | Andry et al. |
| 2007/0025082 A1 | | 2/2007 | Lee et al. |
| 2007/0107875 A1 | | 5/2007 | Lee et al. |
| 2008/0096320 A1 | | 4/2008 | Farrar |
| 2009/0122491 A1 | | 5/2009 | Martin et al. |
| 2010/0116534 A1 | | 5/2010 | Choi et al. |
| 2010/0230805 A1 | | 9/2010 | Refai-Ahmed |
| 2010/0277868 A1 | * | 11/2010 | Beaupre ............... H01L 23/473 |
| | | | 361/700 |
| 2010/0300202 A1 | | 12/2010 | Joyce |
| 2011/0129986 A1 | | 6/2011 | Libralesso et al. |
| 2013/0044431 A1 | | 2/2013 | Koeneman |
| 2013/0050944 A1 | | 2/2013 | Shepard |
| 2013/0087904 A1 | | 4/2013 | Clark et al. |
| 2014/0126150 A1 | * | 5/2014 | Song .................... H01L 23/473 |
| | | | 361/699 |
| 2015/0194363 A1 | | 7/2015 | Jun et al. |
| 2016/0276314 A1 | | 9/2016 | Ching et al. |
| 2017/0012016 A1 | | 1/2017 | Joshi et al. |
| 2017/0092565 A1 | | 3/2017 | Chen et al. |
| 2017/0103937 A1 | | 4/2017 | Hsieh et al. |
| 2018/0053730 A1 | | 2/2018 | Shao et al. |
| 2018/0087842 A1 | | 3/2018 | Chainer et al. |
| 2018/0090427 A1 | | 3/2018 | Bernstein et al. |
| 2018/0160565 A1 | | 6/2018 | Parida |
| 2018/0211900 A1 | | 7/2018 | Gutala et al. |
| 2018/0308783 A1 | | 10/2018 | Refai-Ahmed et al. |
| 2019/0008071 A1 | | 1/2019 | Kim |
| 2019/0355706 A1 | | 11/2019 | Enquist et al. |
| 2019/0385928 A1 | | 12/2019 | Leobandung |
| 2020/0035583 A1 | | 1/2020 | Beauchemin et al. |
| 2020/0105639 A1 | | 4/2020 | Valavala et al. |
| 2020/0312742 A1 | | 10/2020 | Lofgreen et al. |
| 2020/0343160 A1 | | 10/2020 | Mizerak et al. |
| 2020/0350233 A1 | | 11/2020 | Mizerak et al. |
| 2020/0352053 A1 | | 11/2020 | Mizerak et al. |
| 2020/0395313 A1 | | 12/2020 | Mallik et al. |
| 2021/0066164 A1 | | 3/2021 | Wu et al. |
| 2021/0175143 A1 | | 6/2021 | Yu et al. |
| 2021/0183741 A1 | | 6/2021 | Jha et al. |
| 2021/0193548 A1 | | 6/2021 | Wan et al. |
| 2021/0193620 A1 | | 6/2021 | Refai-Ahmed et al. |
| 2021/0280497 A1 | | 9/2021 | Brun et al. |
| 2021/0288037 A1 | | 9/2021 | Tao et al. |
| 2021/0378106 A1 | | 12/2021 | Iyengar et al. |
| 2021/0378139 A1 | | 12/2021 | Rice et al. |
| 2021/0410329 A1 | | 12/2021 | Yang et al. |
| 2022/0037231 A1 | | 2/2022 | Hsiao et al. |
| 2022/0087059 A1 | | 3/2022 | Sathyamurthy et al. |
| 2022/0117115 A1 | | 4/2022 | Malouin et al. |
| 2022/0130734 A1 | | 4/2022 | Chiu et al. |
| 2022/0189850 A1 | | 6/2022 | Liff et al. |
| 2022/0210949 A1 | | 6/2022 | Edmunds et al. |
| 2022/0230937 A1 | * | 7/2022 | Malouin ............... H01L 23/473 |
| 2022/0408592 A1 | | 12/2022 | Malouin et al. |
| 2023/0048500 A1 | | 2/2023 | Malouin et al. |
| 2023/0154828 A1 | | 5/2023 | Haba et al. |
| 2023/0156959 A1 | | 5/2023 | Malouin et al. |
| 2023/0207474 A1 | | 6/2023 | Uzoh et al. |
| 2023/0245950 A1 | | 8/2023 | Haba et al. |
| 2023/0284421 A1 | | 9/2023 | Malouin et al. |
| 2023/0298969 A1 | | 9/2023 | Park et al. |
| 2024/0038633 A1 | * | 2/2024 | Haba ..................... H01L 24/08 |
| 2024/0203823 A1 | | 6/2024 | Uzoh et al. |
| 2024/0222222 A1 | | 7/2024 | Haba et al. |
| 2024/0222226 A1 | | 7/2024 | Haba |
| 2024/0249995 A1 | | 7/2024 | Haba |
| 2024/0249998 A1 | | 7/2024 | Gao et al. |
| 2024/0266255 A1 | | 8/2024 | Haba et al. |

FOREIGN PATENT DOCUMENTS

| | | |
|---|---|---|
| CN | 115719735 A | 2/2023 |
| JP | 2000-340727 A | 12/2000 |
| KR | 10-1049508 B1 | 7/2011 |
| KR | 10-2023-0136509 A | 9/2023 |
| TW | 200834871 A | 8/2008 |
| WO | 2013/097146 A1 | 7/2013 |

OTHER PUBLICATIONS

Francisco Pires, "TSMC Exploring On-Chip, Semiconductor-Integrated Watercooling", tom's Hardware, retrieved from https://www.tomshardware.com/news/tsmc-exploring-on-chip-semiconductor-integrated-watercooling, Jul. 13, 2021, 23 pages.

IBM, "Functional electronic packaging—Thermal management roadmap", available online at <https://web.archive.org/web/20170220095511/https://www.zurich.ibm.com/st/electronicpackaging/cooling.html>, Feb. 20, 2017, 7 pages.

International Search Report and Written Opinion received for PCT Patent Application No. PCT/US23/28942, mailed on Nov. 16, 2023, 12 pages.

International Search Report and Written Opinion received for PCT Patent Application No. PCT/US23/84874, mailed on Apr. 22, 2024, 7 pages.

International Search Report and Written Opinion received for PCT Patent Application No. PCT/US23/85801, mailed on Apr. 26, 2024, 8 pages.

(56) References Cited

OTHER PUBLICATIONS

International Search Report and Written Opinion received for PCT Patent Application No. PCT/US23/85816, mailed on Apr. 23, 2024, 11 pages.

International Search Report and Written Opinion received for PCT Patent Application No. PCT/US23/86233, mailed on Apr. 26, 2024, 7 pages.

Kaplan, F. et al., "LoCool: Fighting Hot Spots Locally for System Energy Efficiency" IEEE Transactions on Computer-Aided Design of Intergrated Circuits and Systems, 39(4):895-908 (2020).

U.S. Appl. No. 18/129,567, filed Mar. 31, 2023, First Name Inventor: Cyprian Emeka Uzoh, "Embedded Cooling Systems for Device Packages and Methods of Cooling Packaged Devices".

PCT Application No. PCT/US2024/022253, International Search Report and Written Opinion dated Jul. 17, 2024, 14 pages.

Shamsa, M., et al., "Thermal conductivity of diamond-like carbon films", Applied Physics Letters, vol. 89, No. 16, Oct. 20, 2006, pp. 161921-161921-3.

Wu, C. J., et al., "Ultra High Power Cooling Solution for 3D-Ics", 2021 Symposium on VLSI Technology, Jun. 2021, 2 pages.

"KoolMicro Inc. developed the World's First 2,000 W/cm2 Cooling Technology for High Heat Generation Chips," Press Release, 2 pages, downloaded from www.semiconductorpackagingnews.com/uploads/1/KoolMicro_High_Cooling_Power_Density.pdf on Nov. 22, 2023.

"Single-Phase Direct-to-Chip Liquid Cooling," 6 pages, downloaded from https://jetcool.com/post/single-phase-direct-to-chip-liquid-cooling-microconvective-vs-microchannel-liquid-cooled-cold-plates/ on Mar. 7, 2024.

"Microconvective Liquid Cooling for high power electronics," https://jetcool.com/technology/, downloaded Mar. 7, 2024, 6 pages.

Benson D.A. et al., "Micro-Machined Heat Pipes in Silicon MCM Substrates", Sandia National Laboratories, Sandia Report: SAND97-0100-UC-704, printed Jan. 1997, 17 pages.

International Search Report and Written Opinion mailed Jun. 5, 2024, in International Application No. PCT/US2024/013758, 9 pages.

International Search Report and Written Opinion mailed Mar. 16, 2023, in International Application No. PCT/US2022/050105, 9 pages.

International Search Report and Written Opinion mailed May 30, 2023, in International Application No. PCT/US2023/061494, 9 pages.

Johnstone, Caitlin, "Coolant-on-Chip: Say Goodbye to Thermal Interfaces," jetcool, Jun. 9, 2020, https://jetcool.com/post/coolant-on-chip-say-goodbye-to-thermal-interfaces/, downloaded Feb. 29, 2024, 7 pages.

Walsh, Stephen Michael, "Microjet Impingement Cooling of High Power-Density Electronics," Thesis, submitted May 11, 2018, 93 pages.

* cited by examiner

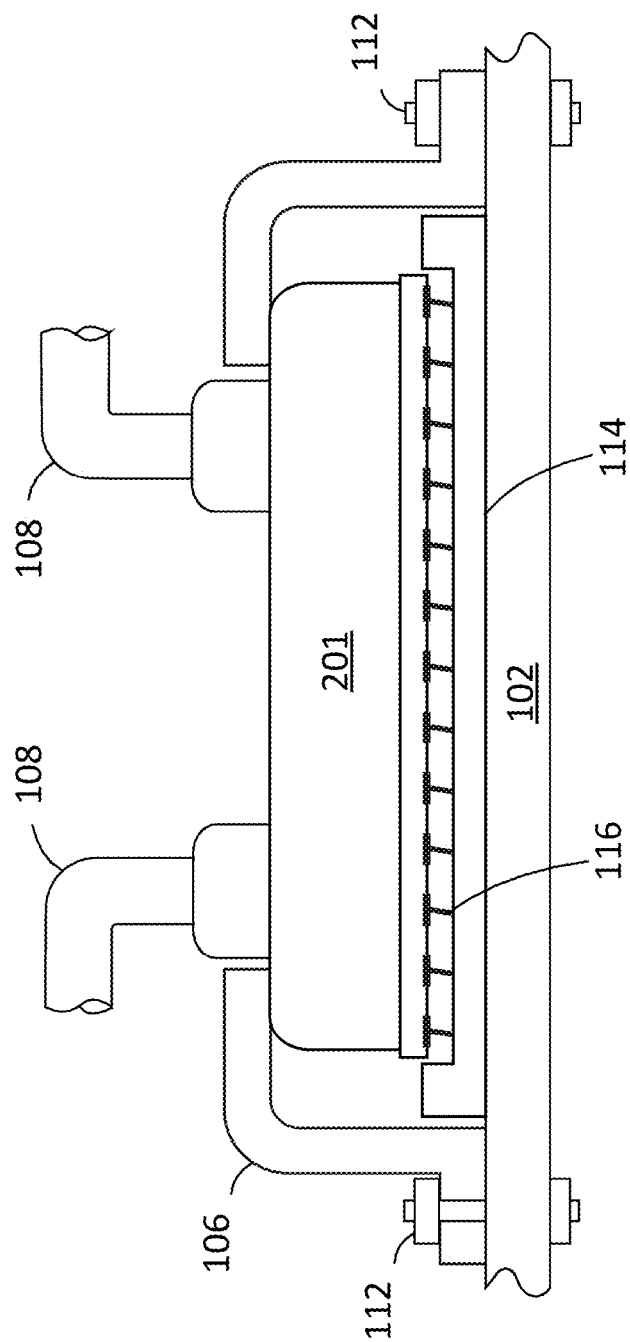

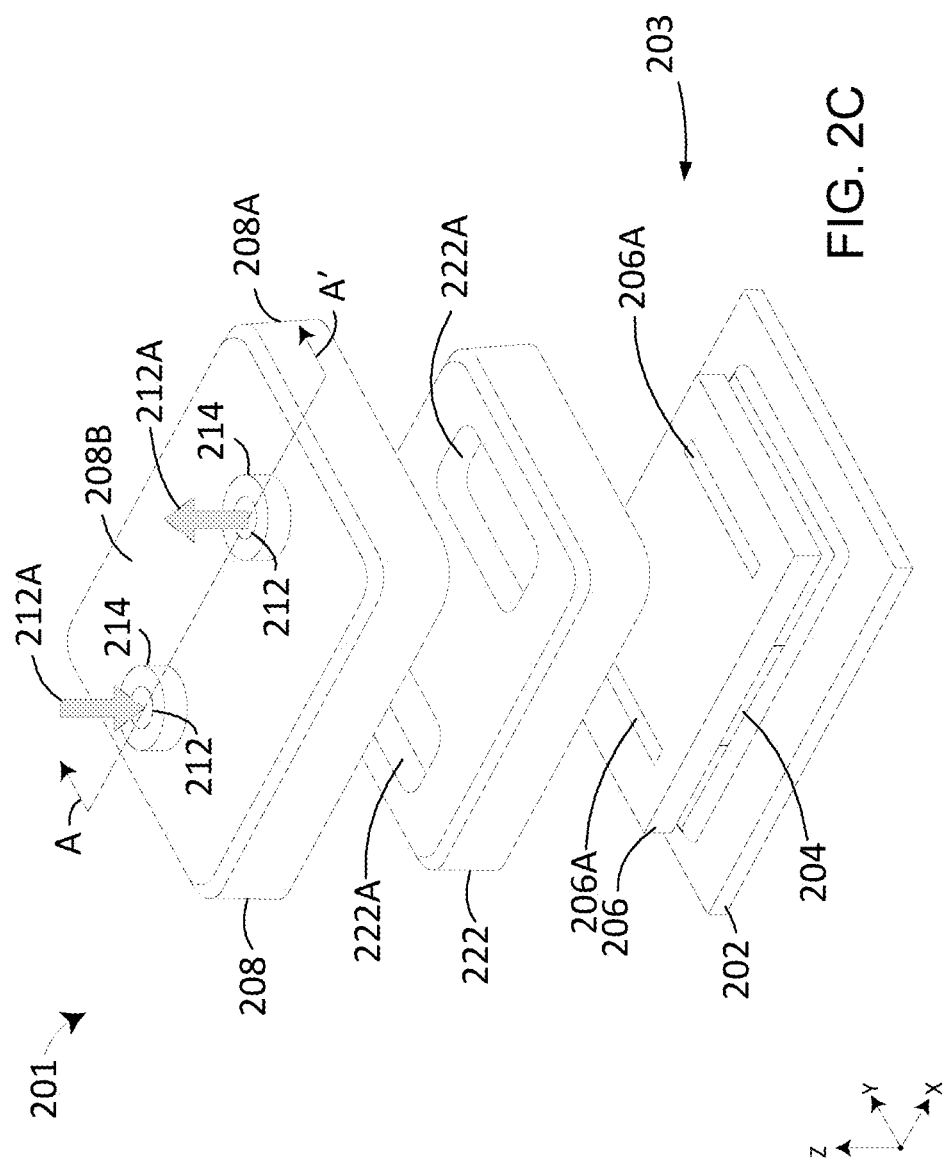

COLD PLATE CAVITY DESIGNS FOR IMPROVED THERMAL PERFORMANCE

CROSS-REFERENCE TO RELATED APPLICATIONS

This application claims the benefit of U.S. Provisional Patent Application No. 63/572,054, filed Mar. 29, 2024, and U.S. Provisional Patent Application No. 63/651,799, filed May 24, 2024, both of which are incorporated by reference herein in their entireties.

BACKGROUND

The present disclosure relates to advanced packaging for microelectronic devices, and in particular, embedded cooling systems for device packages and methods of manufacturing the same.

SUMMARY

Energy consumption poses a critical challenge for the future of large-scale computing as the world's computing energy requirements are rising at a rate that most would consider unsustainable. Some models predict that the information, communication and technology (ICT) ecosystem could exceed 20% of global electricity use by 2030, with direct electrical consumption by large-scale computing centers accounting for more than one-third of that energy usage. A significant portion of the energy used by such large-scale computing centers is devoted to cooling, since even small increases in operating temperatures can negatively impact the performance of microprocessors, memory devices, and other electronic components. While some of this energy is expended to operate the cooling systems that are directly cooling the chips (e.g., heat spreaders, heat pipes, etc.), energy consumption/costs for indirect cooling can also be quite staggering. Indirect cooling energy costs include, for example, cooling or air conditioning of data center buildings. Data center buildings can house thousands, to tens of thousands or more, of high-performance chips in server racks, and each of those high-performance chips is a heat source. An uncontrolled ambient temperature in a data center will adversely affect the performance of the individual chips, and the data center system performance as a whole.

Thermal dissipation in high-power density chips (semiconductor devices/dies) is also a critical challenge as improvements in chip performance (e.g., through increased gate or transistor density due to advanced processing nodes, evolution of multi-core microprocessors, etc.) have resulted in increased power density and a corresponding increase in thermal flux that contributes to elevated chip temperatures. Higher density of transistors also increases the length of metal wiring on the chips, which generates its own additional thermal flux due to Joule heating of these wires due to higher currents. These elevated temperatures are undesirable as they can degrade the chip's operating performance, efficiency, reliability, and amount of remaining life. Cooling systems used to maintain the chip at a desired operating temperature typically remove heat using one or more heat dissipation devices (e.g., thermal spreaders, heat pipes, cold plates, liquid cooled heat pipe systems, thermal-electric coolers, heat sinks, etc.). One or more thermal interface material(s) (e.g., thermal paste, thermal adhesive, and/or thermal gap filler), may be used to facilitate heat transfer between the surfaces of a chip and heat dissipation device(s). A thermal interface material(s) (TIM(s)) is any material that is inserted between two components to enhance the thermal coupling therebetween. Unfortunately, the combined thermal resistance of (i) the thermal resistance of interfacial boundary regions between a TIM(s) and the chip and/or the heat dissipation device(s), and (ii) the thermal resistance of a thermal interface material(s) itself can inhibit heat transfer from the chip to the heat dissipation devices, undesirably reducing the cooling efficiency of the cooling system.

Generally speaking, there are multiple components between the heat dissipating sources (i.e., active circuitry) in the chips and the heat dissipation devices, each of which contributes to the system thermal resistance cumulatively along the heat transfer paths and raises chip junction temperatures from the ambient.

Such cooling systems can suffer from reduced cooling efficiency due to the design and manufacture of system components.

Accordingly, there exists a need in the art for improved energy-efficient cooling systems, by reducing system thermal resistance, and methods of manufacturing the same.

BRIEF DESCRIPTION OF THE DRAWINGS

The above and other objects and advantages of the disclosure will be apparent upon consideration of the following detailed description, taken in conjunction with the accompanying drawings, in which:

FIG. 2B is a schematic partial sectional side view of a device package mounted on a PCB, in accordance with some embodiments of the present disclosure;

FIG. 2C is a schematic exploded isometric view of the device package in FIG. 2B, in accordance with some embodiments of the present disclosure;

Figure 1:
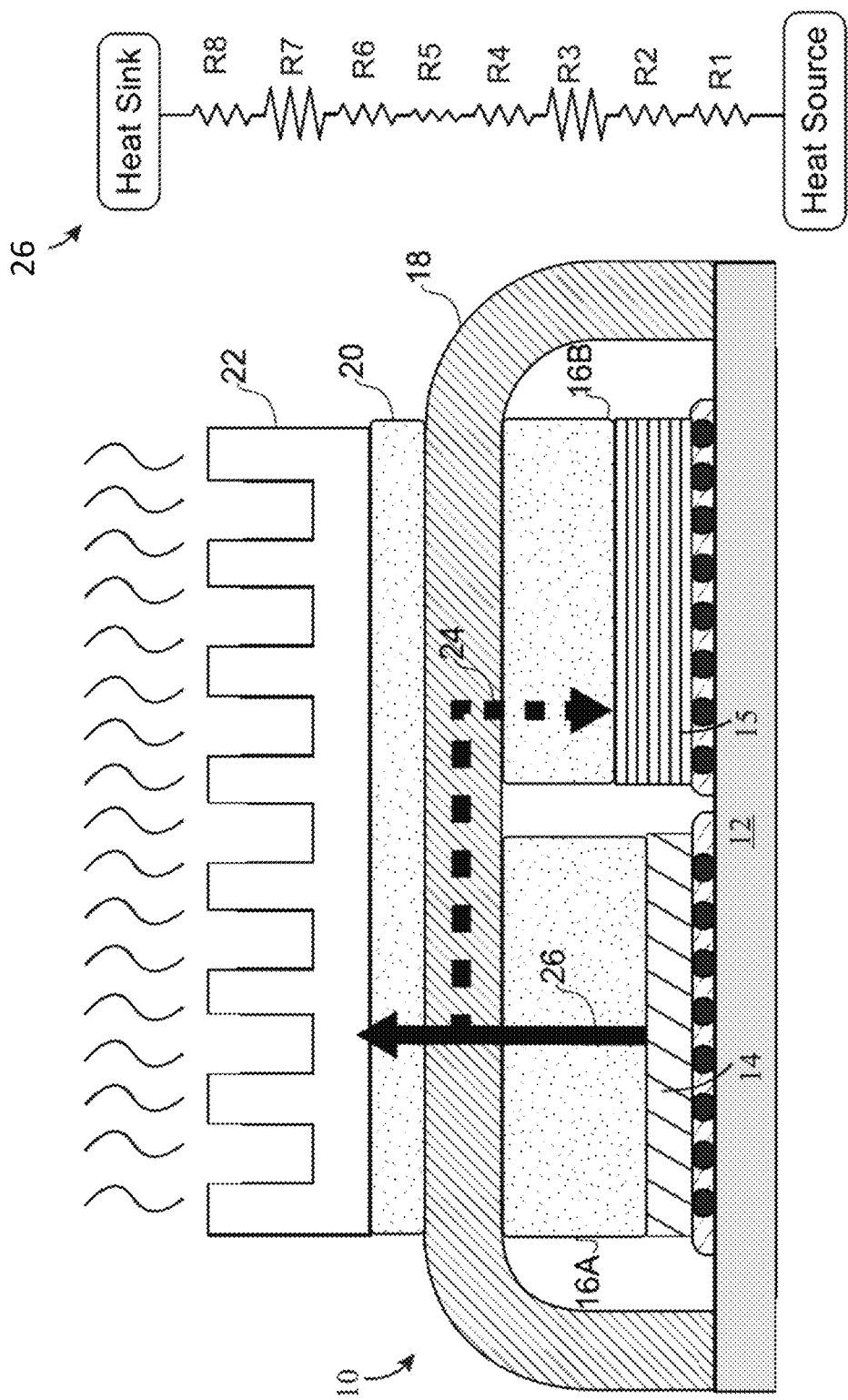
FIG. 1 illustrates a device package with an external heat sink, in accordance with some embodiments of the disclosure.

The figures herein depict various embodiments of the present disclosure for purposes of illustration only. It will be appreciated that additional or alternative structures, assemblies, systems, and methods may be implemented within the principles set out by the present disclosure.

DETAILED DESCRIPTION

As used herein, the term "substrate" means and includes any workpiece, wafer, or article that provides a base material or supporting surface from which or upon which components, elements, devices, assemblies, modules, systems, or features of the heat-generating devices, packaging components, and cooling assembly components described herein may be formed or mounted. The term "substrate" also includes "semiconductor substrates" that provide a supporting material upon which elements of a semiconductor device are fabricated or attached, and any material layers, features, and/or electronic devices formed thereon, therein, or therethrough. Examples of substrate material that may be used in applications that generate high thermal density include, but are not limited to, Si, GaN, SiC, InP, GaP, InGaN, AlGaInP, AlGaAs, etc.

As described below, the semiconductor substrates herein generally have a "device side," (e.g., the side on which semiconductor device elements are fabricated, such as transistors, resistors, and capacitors) and a "backside" that is opposite the device side. The term "active side" should be understood to include a surface of the device side of the substrate and may include the device side surface of the semiconductor substrate and/or a surface of any material layer, device element, or feature formed thereon or extending outwardly therefrom, and/or any openings formed therein. Thus, it should be understood that the material(s) that forms the active side may change depending on the stage of device fabrication and assembly. Similarly, the term "non-active side" (opposite the active side) includes the non-active side of the substrate at any stage of device fabrication, including the surfaces of any material layer, any feature formed thereon, or extending outwardly therefrom, and/or any openings formed therein. Thus, the terms "active side" or "non-active side" may include the respective surfaces of the semiconductor substrate at the beginning of device fabrication and any surfaces formed during material removal, (e.g., after substrate thinning operations). Depending on the stage of device fabrication or assembly, the terms "active sides" and "non-active sides" are also used to describe surfaces of material layers or features formed on, in, or through the semiconductor substrate, whether or not the material layers or features are ultimately present in the fabricated or assembled device. For example, in some instances, the term "active side" is used to indicate a surface of a substrate that will in the future, but does not yet, include semiconductor device elements.

Spatially relative terms are used herein to describe the relationships between elements, such as the relationships between substrates, heat-generating devices, cooling assembly components, device packaging components, and other features described below. Unless the relationship is otherwise defined, terms such as "above," "over," "upper," "upwardly," "outwardly," "on," "below," "under," "beneath," "lower," "top," "bottom" and the like are generally made with reference to the X, Y, and Z directions set forth by X, Y and Z axes in the drawings. Thus, it should be understood that the spatially relative terms used herein are intended to encompass different orientations of the substrate and, unless otherwise noted, are not limited by the direction of gravity. Unless the relationship is otherwise defined, terms describing the relationships between elements such as "disposed on," "embedded in," "coupled to," "connected by," "attached to," "bonded to," and the like, either alone or in combination with a spatially relevant term, include both relationships with intervening elements and direct relationships where there are no intervening elements. Furthermore, the term "horizontal" is generally made with reference to the X-axis direction and the Y-axis direction set forth in the drawings. The term "vertical" is generally made with reference to the Z-axis direction set forth in the drawings.

Various embodiments disclosed herein include bonded structures in which two or more elements are directly bonded to one another without an intervening adhesive (referred to herein as "direct bonding", or "directly bonded"). In some embodiments, direct bonding includes the bonding of a single material on the first of the two or more elements and a single material on a second one of the two or more elements, where the single material on the different elements may or may not be the same. For example, bonding a layer of one inorganic dielectric (e.g., silicon oxide) to another layer of the same or different inorganic dielectric. As discussed in more detail below, the process of direct bonding provides a reduction of thermal resistance between a semiconductor device and a cold plate. Examples of dielectric materials used in direct bonding include oxides, nitrides, oxynitrides, carbonitrides, and oxycarbonitrides, etc., such as, for example, silicon oxide, silicon nitride, silicon oxynitride, silicon carbonitride, silicon oxycarbonitride, etc. Direct bonding can also include bonding of multiple materials on one element to multiple materials on the other element (e.g., hybrid bonding). As used herein, the term "hybrid bonding" refers to a species of direct bonding having both i) at least one (first) nonconductive feature directly bonded to another (second) nonconductive feature, and ii) at least one (first) conductive feature directly bonded to another (second) conductive feature, without any intervening adhesive. In some hybrid bonding embodiments, there are many first conductive features, each directly bonded to a second conductive feature, without any intervening adhesive. In some embodiments, nonconductive features on the first element are directly bond to nonconductive features of the second element at room temperature without any intervening adhesive, which is followed by bonding of conductive features of the first element directly bonded to conductive features of the second element via annealing at slightly higher temperatures (e.g., >100° C., >200° C., >250° C., >300° C., etc.)

Unless otherwise noted, the terms "cooling assembly" and "integrated cooling assembly" generally refer to a semiconductor device and a cold plate attached to the semiconductor device. Typically, the cold plate is formed with recessed surfaces that define one or more fluid cavities (e.g., coolant chamber volume(s) or coolant channel(s)) between the cold plate and the semiconductor device. In embodiments where the cold plate is formed with plural fluid cavities, each fluid cavity may be defined by cavity dividers and/or sidewalls of the cold plate. For example, cavity dividers may be spaced apart from each other and extend laterally between opposing cold plate sidewalls (e.g., in one direction between a first pair of opposing cold plate sidewalls, or in two directions between orthogonal pairs of opposing cold plate sidewalls). The cavity dividers and the cold plate sidewalls may collectively define adjacent fluid cavities therebetween. The cold plate may comprise a polymer material.

The cold plate may be attached to the semiconductor device by use of a compliant adhesive layer or by direct bonding or hybrid bonding. For example, the cold plate may include material layers and/or metal features that facilitate direct bonding or hybrid bonding with the semiconductor device. Beneficially, the backside of the semiconductor device is directly exposed to coolant fluids flowing through the integrated cooling assembly, thus providing for direct heat transfer therebetween. Unless otherwise noted, the integrated cooling assemblies described herein may be used with any desired fluid (e.g., liquid, gas, and/or vapor-phase coolants, such as water, glycol, etc.).

Exemplary fluids available for use in the various thermal solution embodiments include: water (either purified or deionized), a glycol (e.g., ethylene glycol, propylene glycol), glycols mixed with water (e.g., ethylene glycol mixed with water (EGW) or propylene glycol mixed with water (PGW)), dielectric fluids (e.g. fluorocarbons, polyalphaolefin (PAO), isoparaffins, synthetic esters, or very high viscosity index (VHVI) oils), or mineral oils. Additionally, depending upon design and operating conditions, these fluids may be used in single-phase liquid, single-phase vapor, two-phase liquid/vapor or two-phase solid/liquid. All of these fluids and fluid mixtures will alter the thermohydraulic and heat transfer properties by altering the temperatures where phase change occurs, as well as meeting design temperature and pressure conditions for the component being cooled or warmed and the thermal solution being deployed. Additionally, multiple combinations of the fluid phases may be employed in various hybrid configurations to meet the particular cooling or warming needs of a respective implementation and still be within the scope of the contemplated embodiments.

Additionally, in some embodiments part or all the cooling is provided by gases. Exemplary gases include atmospheric air and/or one or more inert gases such as nitrogen. Atmospheric air may be taken to mean the mixture of different gases in Earth's atmosphere made up of about 78% nitrogen and 21% oxygen.

Depending on the design needs of a thermal solution system using the disclosed embodiments, engineered dielectric cooling fluids may be used. Some examples of dielectric fluids used for cooling semiconductors include: 3M™ Fluorinert™ Liquid FC-40-A non-flammable, dielectric fluid that can be used in direct contact with live electronics; 3M™ Novec™ Engineered Fluids-A non-flammable, dielectric fluid that can be used in direct contact with live electronics; Galden® PFPE (perfluoropolyether) products used as heat transfer fluids; EnSolv Fluoro HTF—A solvent with a high boiling point and low pour point that can be used for semiconductor wafer cooling. It is understood that in the selection of the cooling fluid, system design aspects such as operating temperatures and pressures, fluid flow rates, fluid viscosity, and other properties will require evaluation when selecting the appropriate cooling fluid.

In some embodiments, the cooling fluids may contain microparticles and/or nanoparticle additives to enhance the conductivity of the cooling fluid within the integrated cooling assemblies. Choi and Eastman (1995) from Argonne National Laboratory, U.S.A. (Yu et al., 2007) coined the word "nanofluid." Nanofluids are engineered fluids prepared by suspending the nano-sized (1-100 nm) particles of metals/non-metals and their oxide(s) with a base/conventional fluid. The suspension of high thermal conductivity metals/non-metals and their oxides nanoparticles enhances the thermal conductivity and heat transfer ability, etc. of the base fluid. The additives to the underlying cooling fluid may comprise for example, nanoparticles of carbon nanotube, nanoparticles of graphene, or nanoparticles of metal oxides. When the cooling fluid contains microparticles, the microparticles are typically 10 microns or less in diameter. Silicon oxide microparticles may be used.

The volume concentration of these micro or nanoparticles may be less than 1%, less than 0.2%, or less than 0.05%. Depending upon the liquid and micro/nanoparticle type chosen for the cooling fluid, higher volume concentrations of 10% or less, 5% or less, or 2% or less may be used. The cooling fluids may also contain small amounts of glycol or glycols (e.g., propylene glycol, ethylene glycol etc.) to reduce frictional shear stress and drag coefficient in the cooling fluid within the integrated cooling assembly. The availability of different base fluids (e.g., water, ethylene glycol, mineral or other stable oils, etc.) and different nanomaterials provide a variety of nanomaterial options for nanofluid solutions to be used in the various embodiments. These nanomaterial option groups such as aforementioned metals (e.g., Cu, Ag, Fe, Au, etc.), metal oxides (e.g., $TiO_2$, $Al_2O_3$, CuO, etc.), carbons (e.g., CNTS, graphene, diamond, graphite . . . etc.), or a mixture of different types of nanomaterials. Metal nanoparticles (Cu, Ag, Au . . . ), metal oxide nanoparticles ($Al_2O_3$, $TiO_2$, CuO), and carbon-based nanoparticles are commonly employed elements. Silicon oxide nanoparticles may also be used. Using cooling fluids with micro and/or nanoparticles when practicing the various embodiments disclosed herein can result in increased heat removal efficiencies and effectiveness.

The fluid control design aspects of specific embodiments may require the nanofluids to be magnetic to facilitate either movement or cessation of movement of the fluids within the semiconductor structures. Magnetic nanofluids (MNFs) are suspensions of a non-magnetic base fluid and magnetic nanoparticles. Magnetic nanoparticles may be coated with surfactant layers such as oleic acid to reduce particle agglomeration and/or settling. Magnetic nanoparticles used in MNFs are usually made of metal materials (ferromagnetic materials) such as iron, nickel, cobalt, as well as their oxides such as spinel-type ferrites, magnetite ($Fe_3O_4$), and so forth. The magnetic nanoparticles used in MNFs typically range in size from about 1 to 100 nanometers (nm).

This disclosure describes embodiments involving the architecture of system and component elements that can be employed to provide for the cooling of semi-conductor components, packaging, and boards. However, those skilled in the art will appreciate the disclosed components and arrangements can be deployed and used in scenarios where component heat up or thermal warm up is desired for a component that is currently outside the low end of the desired operational range. Components that are outside the low end of their operational range can, if started in a cold environment, experience thermal warping or cracking up to and including thermal overexpansion and contact separation that may impair the successful operation of the system. Therefore, in these scenarios, the architectures and embodiments disclosed herein can be used where the indirect thermal solutions supporting them are repurposed or operated in a hybrid configuration to provide warming fluids or heat transfer media to accomplish the warm-up or heat-up scenario. These scenarios are controlled by systems not shown here to bring temperatures up at a speed or timing that enables the materials to avoid the excessive thermal expansion or unequal thermal expansion that may occur among the materials of the semiconductor or packaging being serviced by the thermal solution. Once the component or packaging is brought up into the normal operating range, it can be safely started and brought to a useful operational state.

Considering the warm-up or heat-up embodiments introduced above, the balance of this disclosure and terms used should be viewed in a light that also considers the design option for such warm-up or heat-up. Thus, where terms such as cooling channel, cooling chamber volume, cavity, and cooling port are used, for example, such terms could also be considered as a thermal control channel, a thermal control volume, or a thermal control port, respectively. A person of skill would understand that heat flux or heat transfer would go in a different direction, but the design concepts are similar and can be successfully employed in the various embodiments.

In some embodiments, a cooling channel is a liquid cooling channel, and a liquid may flow through the liquid cooling channel. In some embodiments, the liquid may comprise a water and/or glycol (e.g., propylene glycol, ethylene glycol, and mixtures thereof).

As described below, coolant fluid flowing through a cold plate may be used to control the temperature of semiconductor devices. The fluid flowing across the surface of the semiconductor device absorbs heat and conducts heat away from the semiconductor device.

FIG. 1 is a schematic side view of a device package 10 and a heat sink 22 attached to the device package 10. The device package 10 typically includes a package substrate 12, a first device 14, a device stack 15, a heat spreader 18, and first TIM layers 16A, 16B thermally coupling the first device 14 and the device stack 15 to the heat spreader 18. The device package 10 is thermally coupled to the heat sink 22 through a second TIM layer 20. The TIM layers 16A, 16B, 20 facilitate thermal contact between components in the device package 10 and between the device package 10 and the heat sink 22.

As heat flux density increases with increasing power density in advanced semiconductor devices, the cumulative thermal resistance of the system illustrated in FIG. 1 is increasingly problematic as heat cannot be dissipated quickly enough to allow semiconductor devices to run at optimal power. Consequently, the energy efficiency of semiconductor devices is reduced. Furthermore, heat is transferred between semiconductor devices within the device package 10, as shown with heat transfer path 24 (illustrated as a dashed line), where heat may be undesirably transferred from the first device 14 having a high heat flux, such as a central processing unit (CPU) or a graphical processing unit (GPU), to the device stack 15 having low heat flux, such as memory, through the heat spreader 18.

For example, as shown in FIG. 1, each device package component and the respective interfacial boundaries therebetween have a corresponding thermal resistance that forms heat transfer path 26 (illustrated by arrow 26 in FIG. 1). The right-hand side of FIG. 1 illustrates the heat transfer path 26 as a series of thermal resistances R1-R8 between a heat source and a heat sink. Here, R1 is the thermal resistance of the bulk semiconductor material of the first device 14. R3 and R7 are the thermal resistances of the first TIM layers 16A, 16B and the second TIM layer 20, respectively. R5 is the thermal resistance of the heat spreader 18. R2, R4, R6, and R8 represent the thermal resistance at the interfacial region of the components (e.g., contact resistances). In a typical cooling system, R3 and R7 may account for 80% or more of the cumulative thermal resistance of the heat transfer path 26, and R5 may account for 5% or more. R1 of the first device 14 and R2, R4, R6, and R8 of the interfaces account for the remaining cumulative thermal resistance. Accordingly, embodiments described herein provide for integrated cooling assemblies embedded within a device package. The embedded cooling assemblies shorten the thermal resistance path between a semiconductor device and a heat sink and reduce thermal communication between semiconductor devices disposed in the same device package, such as described in relation to the figures below.

Figure 2A:
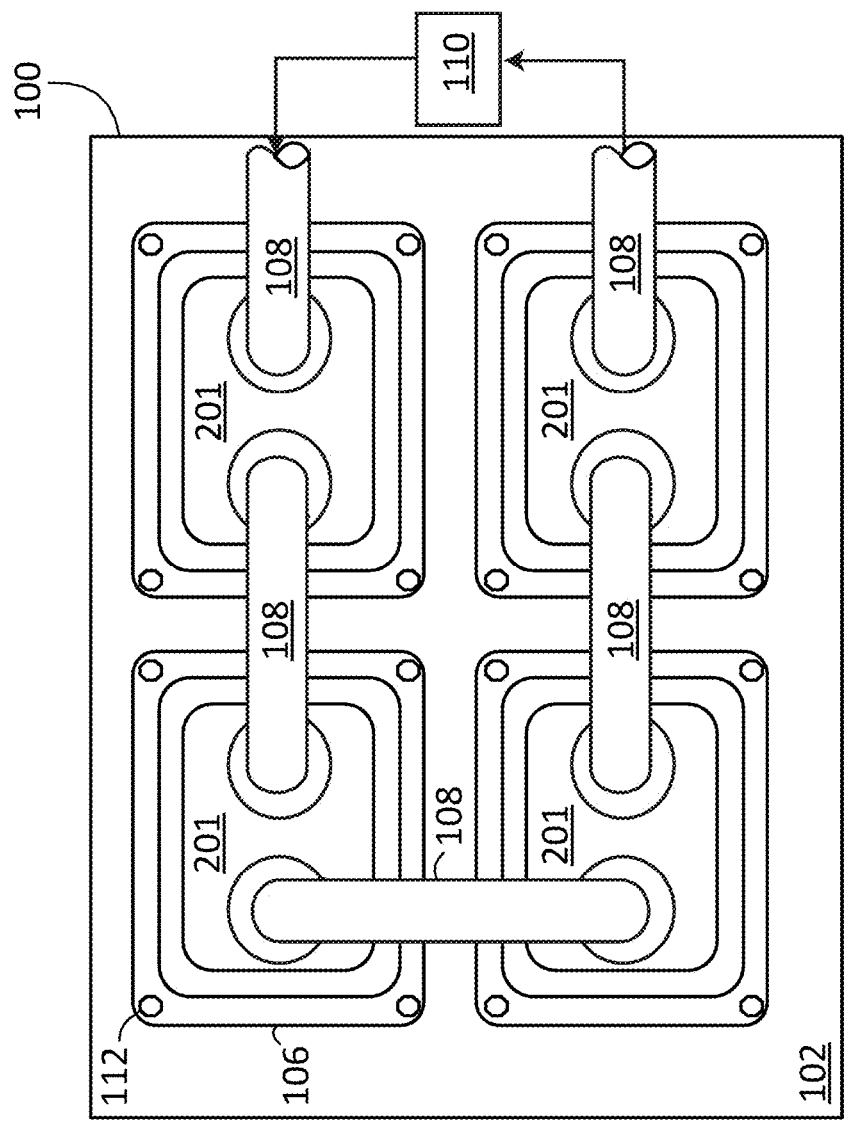
FIG. 2A is a schematic plan view of an example of a system panel, in accordance with some embodiments of the present disclosure.

FIG. 2A is a schematic plan view of an example of a system panel 100, in accordance with some embodiments of the present disclosure. Generally, the system panel 100 includes a printed circuit board (PCB) 102, a plurality of device packages 201 mounted to the PCB 102, and a plurality of coolant lines 108 fluidly coupling each of the device packages 201 to a coolant source 110. It is contemplated that coolant fluid may be delivered to each of the device packages 201 in any desired fluid phase (e.g., liquid, vapor, gas, or combinations thereof) and may flow out from each device package 201 in the same phase or a different phase. In some embodiments, the coolant fluid is delivered to the device packages 201 and returned therefrom as a liquid, whereby the coolant source 110 may comprise a heat exchanger or chiller to maintain the coolant fluid at a desired temperature. In other embodiments, the coolant fluid may be delivered to the device packages 201 as a liquid, vaporized to a vapor within the device packages 201, and returned to the coolant source 110 as a vapor. In those embodiments, the device packages 201 may be fluidly coupled to the coolant source 110 in parallel, and the coolant source 110 may include or further include a compressor (not shown) for condensing the received vapor to a liquid form.

FIG. 2B is a schematic partial sectional side view of a portion of the system panel 100 of FIG. 2A, in accordance with some embodiments of the disclosure. As shown, each device package 201 is fluidly coupled to the plurality of coolant lines 108 and is disposed in a socket 114 of the PCB 102 and connected thereto using a plurality of pins 116, or by other suitable connection methods, such as solder bumps (not shown). The device package 201 may be seated in the socket 114 and secured to the PCB 102 using a mounting frame 106 and a plurality of fasteners 112, (e.g., compression screws, collectively configured to exert a relatively uniform downward force on the upward facing edges of the device package 201). The uniform downward force ensures proper pin contact between the device package 201 and the socket 114.

FIG. 2C is a schematic exploded isometric view of an example device package 201, in accordance with some embodiments of the present disclosure. Generally, the device package 201 includes a package substrate 202, an integrated cooling assembly 203 disposed on the package substrate 202, and a package cover 208 disposed on a peripheral portion of the package substrate 202. Suitable materials that may be used in the package cover 208 include copper, aluminum, metal alloys, etc. The package cover 208 extends over the integrated cooling assembly 203 so that the integrated cooling assembly 203 is disposed between the package substrate 202 and the package cover 208. The integrated cooling assembly 203 typically includes a semiconductor device 204 and a cold plate 206 bonded to the semiconductor device 204. In some embodiments, the cold plate 206 may comprise substrate material like silicon, glass, ceramic, etc. In some embodiments, the lateral dimensions, or footprint, of the cold plate 206 is the same size or larger than the lateral dimensions, or footprint, of the semiconductor device 204. In some embodiments, the footprint of the cold plate, as viewed from a top plan view, is the same size, or is larger than the footprint of the semiconductor device, as viewed from a top plan view. In some embodiments, the footprint of the cold plate 206 may be larger or the same size in one or both directions when compared to the footprint of the semiconductor device 204.

As shown, the device package 201 further includes a sealing material layer 222 that forms a coolant fluid impermeable barrier between the package cover 208 and the integrated cooling assembly 203 that prevents leaking of the coolant fluid outside of the cooling assembly and prevents coolant fluid from reaching an active side 218 (discussed below in relation to FIG. 3) of the semiconductor device 204 and causing damage thereto. In some embodiments, the sealing material layer 222 comprises an adhesive material that reliably attaches the package cover 208 to the integrated cooling assembly 203. In some embodiments, the sealing material layer 222 comprises a polymer or epoxy material that extends upwardly from the package substrate 202 to encapsulate and/or surround at least a portion of the semiconductor device 204. In some embodiments, the sealing material layer 222 may also comprise conductive material (e.g., solder). In other embodiments, the sealing material layer 222 is formed from a molding compound (e.g., a thermoset resin), that when polymerized, forms a hermetic seal between the package cover 208 and the cold plate 206. Here, the coolant fluid is delivered to the cold plate 206 through openings 222A disposed through the sealing material layer 222. As shown, the openings 222A are respectively in registration and fluid communication with inlet and outlet openings 212 of the package cover 208 thereabove and inlet and outlet openings 206A in the cold plate 206 therebelow. In some embodiments, the inlet and outlet openings 206A in the cold plate 206 are outside of the footprint of the semiconductor device.

It will be understood that the openings are shown in a section view. The openings may have any cross-sectional shape that allows fluid to flow therethrough (e.g., rectangular, square, hexagonal or circular cross-sections). For example, the inlet and outlet openings 206A of the cold plate 206 may form an elongated shape extending from one side of the cold plate 206 to another side of the cold plate 206. For example, the inlet and outlet openings 206A may form any shape having a length greater than a width in the X-Y plane (e.g., a rectangular or a trapezoidal shape). A shape in the X-Y plane of the openings 222A disposed through the sealing material layer 222 may be substantially the same as the shape of the inlet and outlet openings 206A of the cold plate 206 in the same place. Furthermore, it will be understood that all references to an opening throughout the present disclosure refer to an opening defined by a sidewall (e.g., opening sidewall).

Generally, the package substrate 202 includes a rigid material, such as an epoxy or resin-based laminate, that supports the integrated cooling assembly 203 and the package cover 208. The package substrate 202 may include conductive features disposed in or on the rigid material that electrically couples the integrated cooling assembly 203 to a system panel, such as the PCB 102.

Figure 3:
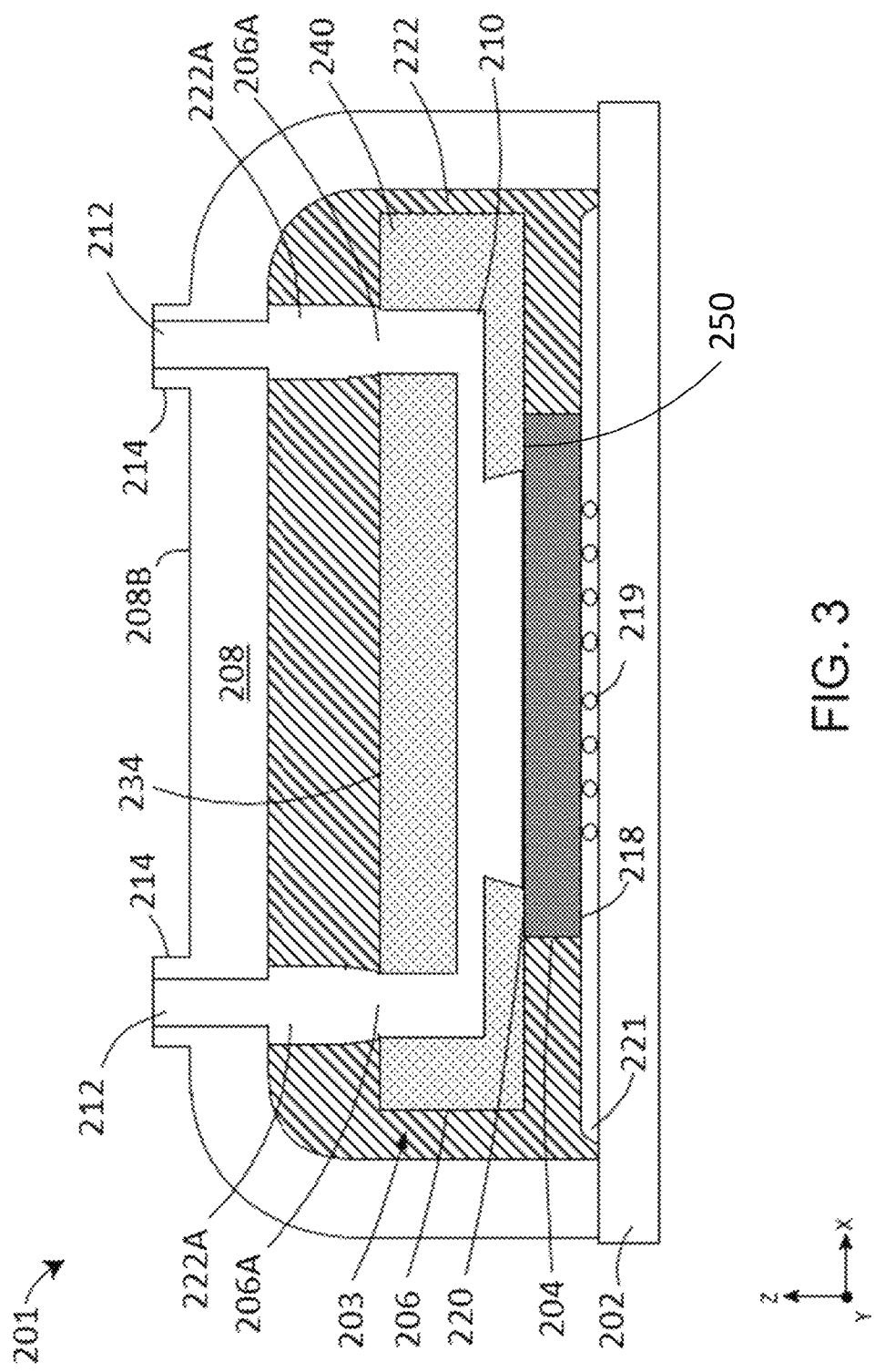
FIG. 3 is a schematic sectional view of an example device package that may be used with the system panel, in accordance with some embodiments of the present disclosure.

FIG. 3 is a schematic sectional view in the X-Z plane of the device package 201 taken along line A-A' of FIG. 2C, in accordance with some embodiments of the disclosure. As illustrated in FIG. 3, the semiconductor device 204 includes the active side 218 that includes device components (e.g., transistors, resistors, and capacitors, formed thereon or therein), and a non-active side, here the semiconductor device backside 220, opposite the active side 218. As shown, the active side 218 is positioned adjacent to and facing towards the package substrate 202. The active side 218 may be electrically connected to the package substrate 202 by use of conductive bumps 219, which are encapsulated by a first underfill layer 221 disposed between the semiconductor device 204 and the package substrate 202. The first underfill layer 221 may comprise a cured polymer resin or epoxy, which provides mechanical support to the conductive bumps 219 and protects against thermal fatigue. In some embodiments, the active side 218 may be electrically connected to another package substrate, another active die, or another passive die (e.g., interposer) using hybrid bonding or conductive bumps 219. The cold plate 206 may be disposed above the package substrate 202 with the semiconductor device 204 disposed therebetween. For example, the semiconductor device 204 (and the first underfill layer 221) may be disposed between the cold plate 206 and the package substrate 202. In some embodiments, the cold plate 206 may be disposed directly on the package substrate 202.

Here, the cold plate 206 comprises a top portion 234 and a sidewall 240 (e.g., a perimeter sidewall defining a perimeter of the cold plate 206) extending downwardly from the top portion 234 to level of the backside 220 of the semiconductor device 204. In some embodiments, the top portion 234, the perimeter sidewall 240, and the backside 220 of the semiconductor device 204 collectively define a coolant channel 210 therebetween. In some embodiments, the cold plate 206 also comprises cavity dividers extending downwardly from the top portion 234 towards the backside 220 of the semiconductor device 204. The cavity dividers may extend laterally and in parallel between an inlet opening 206A of the cold plate 206 and an outlet opening 206A of the cold plate 206 to define coolant channels 210 therebetween. In some embodiments, the cold plate 206 comprises one cavity divider which forms two coolant channels (e.g., one coolant channel on either side of the cavity divider) and portions of the perimeter sidewall 240. In some embodiments, coolant channels 210 may be formed between a cavity divider and a portion of the perimeter sidewall 240 extending parallel to the cavity divider. Alternatively, in other embodiments, the cold plate 206 may comprise plural cavity dividers, for example two cavity dividers, five cavity dividers, or six cavity dividers. In such examples, the cold plate 206 comprises more than two coolant channels 210, for example three coolant channels, four coolant channels, seven coolant channels, or more, defined between the cavity divider(s) and the perimeter sidewall 240.

In some embodiments, cavity dividers comprise cavity sidewalls which form surfaces of corresponding coolant channels 210. In embodiments where plural cavity dividers extend in parallel to each other, cavity sidewalls of adjacent cavity dividers are opposite (e.g., facing) each other. In embodiments comprising a single cavity divider, a first cavity sidewall may be opposite (e.g., face) a first portion of the perimeter sidewall 240 extending parallel to and facing the first cavity sidewall. A second cavity sidewall may be opposite (e.g., face) a second portion of the perimeter sidewall 240 extending parallel to and facing the second cavity sidewall. The first portion of the perimeter sidewall 240 may be an opposite side of the cold plate 206 to the second portion of the perimeter sidewall 240. For example, in embodiments where the cold plate 206 is rectangular, first and second opposing sides of the rectangular cold plate 206 form the first and second portions of the perimeter sidewall 240.

In some embodiments, cavity dividers may be continuous cavity dividers which extend continuously (e.g., in the Y-axis direction) between the inlet opening 206A and the outlet opening 206A of the cold plate 206.

In some embodiments, the backside 220 of the semiconductor device 204 comprises a corrosion protective layer (not shown). The corrosion protective layer may be a continuous layer disposed across the entire backside 220 of the semiconductor device 204, such that the cold plate 206 is attached thereto. Beneficially, the corrosion protective layer provides a corrosion-resistant barrier layer, thus preventing undesired corrosion of the semiconductor device 204 (e.g., the semiconductor substrate material which might otherwise be in direct contact with coolant fluid flowing through a coolant chamber volume 210).

One or more coolant chamber volumes may include one or more coolant channels. The coolant channels may extend between a single inlet opening and a single outlet opening of the cold plate 206, such that the coolant chamber volume(s) and/or coolant channel(s) share the same inlet and outlet openings. In some embodiments, multiple inlet and/or outlet openings may be coupled to the coolant chamber volume(s).

In embodiments having plural coolant chamber volumes and/or plural coolant channels, each coolant chamber volume and/or coolant channel may be connected between a separate inlet opening and a separate outlet opening. In such embodiments, the coolant fluid may be directed to the separate inlet openings and from the separate outlet openings using a manifold disposed above the openings in the Z-axis direction.

In some embodiments, a height in the Z-axis direction of the coolant chamber volume(s) and or coolant channel(s) may be greater than 100 μm, 100 μm-1000 μm, or 100 μm-700 μm. A width in the Y-axis direction of the coolant chamber volume(s) and/or coolant channel(s) may be greater than 100 μm, 100 μm-1000 μm, or 100 μm-700 μm. For example, the width of the coolant chamber volume(s) and/or coolant channel(s) may be greater than the height. A cross-section of the coolant chamber volume(s) and/or coolant channel(s) in the Y-Z plane is wide enough to allow for a pressure drop of 0-20 psi, 3-15 psi, or 4-10 psi.

In some embodiments, preparing a desired surface roughness of the sidewalls of the coolant chamber volume(s) and/or coolant channels may include depositing an organic layer on a photoresist layer after cold plate features have been etched to form a micro-masking layer, such as between 1 to 30 nm. The micro-masking layer may be dry etched to form the desired surface roughness, such as between 0.1 to 3.0 nm.

With reference to FIG. 3, the cold plate 206 is attached to the backside 220 of the device 204 without the use of an intervening adhesive. For example, the cold plate 206 may be directly bonded (e.g., via direct dielectric bonds, direct hybrid bonds, etc.) to the backside 220 of the device 204 at a first interface 250, such that the cold plate 206 and the backside 220 of the device 204 are in direct contact. For example, in some embodiments, one or both of the cold plate 206 and the backside 220 of the semiconductor device 204 may comprise a dielectric material layer (e.g., a first dielectric material layer and a second dielectric material layer respectively), and the cold plate 206 is directly bonded to the backside 220 of the semiconductor device 204 through bonds formed between the dielectric material layers. In some embodiments, one of the cold plate 206 or the backside 220 of the semiconductor device 204 may comprise a thin bonding dielectric layer (e.g., silicon nitride, etc.) and other element(s) may not include any such explicit bonding dielectric layer (or can have only a native oxide layer). In some embodiments, one or more dielectric material layers are continuous layers. In some embodiments, one or more dielectric material layers may not be continuous. For example, a first dielectric material layer may be disposed only on lower surfaces of the cold plate 206 facing the backside 220 of the semiconductor device 204. In some embodiments, portions of a first dielectric material layer may be disposed only on lower surfaces of support features 230 and the perimeter sidewall 240. Beneficially, directly bonding the cold plate 206 to the semiconductor device 204, as described above, reduces the thermal resistance therebetween and increases the efficiency of heat transfer from the semiconductor device 204 to the cold plate 206. In some embodiments, thermal resistance is further reduced by directly bonding lower surfaces of cavity dividers facing the semiconductor device 204 to the backside 220 of the semiconductor device 204.

Figure 4:
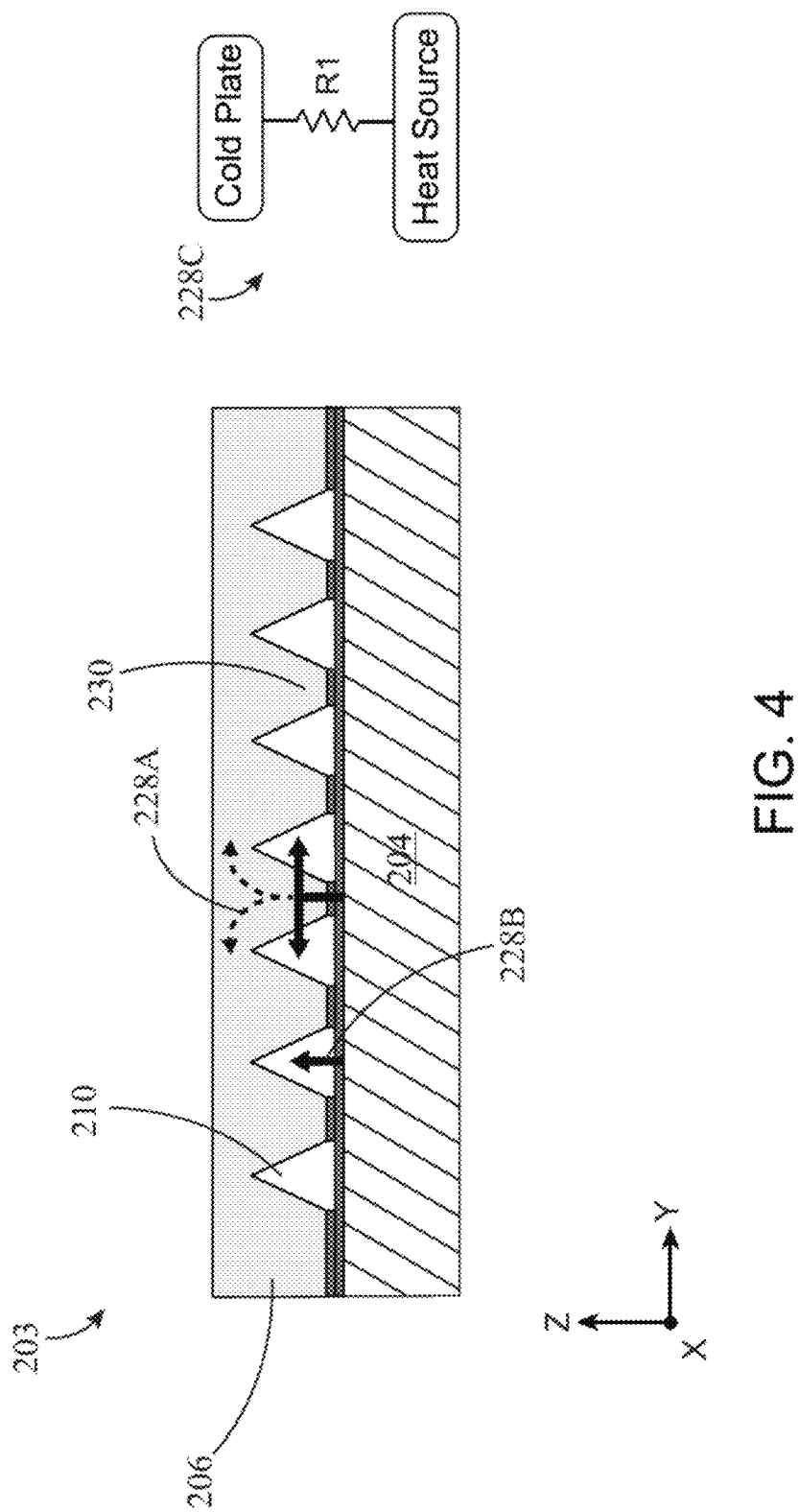
FIG. 4 is a schematic sectional view of an integrated cooling assembly of the device package, in accordance with some embodiments of the present disclosure.

FIG. 4 is a schematic sectional view in the Y-Z plane of the integrated cooling assembly 203, in accordance with some embodiments of the disclosure. In FIG. 4, the cold plate 206 comprises a patterned side that faces towards the semiconductor device 204 and an opposite side that faces towards the package cover 208 (not shown). The patterned side comprises a coolant chamber volume having plural coolant channels 210, which extend laterally between the inlet and outlet openings 106A of the cold plate 206. Each coolant channel 210 comprises cavity sidewalls that define a corresponding coolant channel 210. Portions of the cold plate 206 between the cavity sidewalls form support features 230. The support features 230 provide structural support to the integrated cooling assembly 203 and disrupt laminar fluid flow at the interface of the coolant and the device backside 220, resulting in increased heat transfer therebetween. Furthermore, by introducing plural coolant channels 210 to define separate coolant flow paths, an internal surface area of the cold plate 206 is increased, which further increases the efficiency of heat transfer.

In FIG. 4, arrows 228A and 228B illustrate two different heat transfer paths in the integrated cooling assembly 203. A first heat transfer path illustrated by arrow 228B shows heat generated by the semiconductor device 204 transferring directly from the semiconductor material of the semiconductor device 204 to coolant fluid flowing through the cold plate 206. A second heat transfer path illustrated by arrows 228A shows heat generated by the semiconductor device 204 being transferred from semiconductor material (e.g., silicon material) of the semiconductor device 204 to semiconductor material (e.g., silicon material) of the cold plate 206 structure, propagated throughout the semiconductor material of the cold plate 206 structure (shown as dashed lines), and being transferring into coolant fluid flowing through the cold plate 206. A thermal resistance of the first and second heat transfer paths 228A, 228B is illustrated by heat transfer path 228C, which is shown as thermal resistance R1 between a heat source and a cold plate. Here, R1 is the thermal resistance of the bulk semiconductor material of the semiconductor device 204. It can be seen that the heat transfer path 228C of the integrated cooling assembly 203 is reduced compared to the heat transfer path 26 of the device package 10 of FIG. 1, due to the direct bonding discussed above.

In some embodiments, the cold plate 206 may be attached to the semiconductor device 204 using a hybrid bonding technique, where bonds are formed between one or more dielectric material layers and between metal features, such as between first metal pads and second metal pads, disposed in the one or more dielectric material layers.

Suitable dielectrics that may be used as the one or more dielectric material layers include silicon oxides, silicon nitrides, silicon oxynitrides, silicon carbon nitrides, metal-oxides, metal-nitrides, silicon carbide, silicon oxycarbides, silicon oxycarbonitride, diamond-like carbon (DLC), or combinations thereof. In some embodiments, one or more of the dielectric material layers are formed of an inorganic dielectric material (e.g., a dielectric material substantially free of organic polymers). Typically, one or more of the dielectric layers are deposited to a thickness greater than the thickness of a native oxide, such as about 1 nanometer (nm) or more, 5 nm or more, 10 nm or more, 50 nm or more, or 100 nm or more. In some embodiments, one or more of the dielectric layers are deposited to a thickness of 3 micrometers or less, 1 micrometer or less, 500 nm or less, such as 100 nm or less, or 50 nm or less. The dielectric layer material and thickness may be optimized for lower thermal resistance between the die and the cold plate.

The cold plate 206 may be formed of any suitable material that has sufficient structural strength to withstand the desired pressures of coolant flowing into the coolant chamber volume 210. For example, the cold plate 206 may be formed of semiconductor material like silicon or other engineered materials like glass. In other examples, the cold plate 206 may be formed of a material selected from a group comprising polymers, metals, ceramics, or composites thereof. In some embodiments, the cold plate 206 may be formed of stainless steel (e.g., from a stainless-steel metal sheet) or a sapphire plate.

In some embodiments, the cold plate 206 may be formed of a bulk material having a substantially similar coefficient of linear thermal expansion (CTE) to the bulk material of the substrate 202 and/or the semiconductor device 204, where the CTE is a fractional change in length of the material (in the X-Y plane) per degree of temperature change. In some embodiments, the CTEs of the cold plate 206, the substrate 202, and/or the semiconductor device 204 are matched so that the CTE of the substrate 202 and/or the semiconductor device 204 is within about +/−20% or less of the CTE of the cold plate 206, such as within +/−15% or less, within +/−10% or less, or within about +/−5% or less when measured across a desired temperature range. In some embodiments, the CTEs are matched across a temperature range from about −60° C. to about 100° C. or from about −60° C. to about 175° C. In one example embodiment, the matched CTE materials each include silicon.

In some embodiments, the cold plate 206 may be formed of a material having a substantially different CTE from the semiconductor device 204 (e.g., a CTE mismatched material). In such embodiments, the cold plate 206 may be attached to the semiconductor device 204 by a compliant adhesive layer (not shown) or a molding material that absorbs the difference in expansion between the cold plate 206 and the semiconductor device 204 across repeated thermal cycles.

The package cover 208 shown in FIGS. 2C and 3 generally comprises one or more vertical or sloped sidewall portions 208A and a lateral portion 208B that spans and connects the sidewall portions 208A. The sidewall portions 208A may extend upwardly from a peripheral surface of the package substrate 202 to surround the device 204 and the cold plate 206 disposed thereon. The lateral portion 208B may be disposed over the cold plate 206 and is typically spaced apart from the cold plate 206 by a gap corresponding to the thickness of the sealing material layer 222. Coolant is circulated through the coolant chamber volume 210 through the inlet and outlet openings 212 of the package cover 208 formed through the lateral portion 208B. The inlet and outlet openings 206A of the cold plate 206 may be in fluid communication with the inlet and outlet openings 212 of the package cover 208 through the inlet and outlet openings 222A formed in the sealing material layer 222 disposed therebetween. In certain embodiments, coolant lines 108 (FIGS. 2A-2B) may be attached to the device package 201 by use of connector features formed in the package cover 208, such as threads formed in the sidewalls of the inlet and outlet openings 212 of the package cover 208 and/or protruding features 214 that surround the inlet and outlet openings 212 and extend upwardly from a surface of the lateral portion 208B.

Typically, the package cover 208 is formed of semi-rigid or rigid material so that at least a portion of the downward force exerted on the package cover 208 by the mounting frame is transferred to a supporting surface of the package substrate 202 and not transferred to the cold plate 206 and the semiconductor device 204 therebelow. In some embodiments, the package cover 208 is formed of a thermally conductive metal, such as aluminum or copper. In such embodiments, the package cover 208 functions as a heat spreader that redistributes heat from one or more electronic components of the semiconductor device 204.

It should be noted that the direction in which the coolant fluid flows through the cold plate 206 may be controlled depending on the relative locations of the inlet and outlet openings. For example, the coolant fluid may flow from left to right in the device package 201 of FIG. 3 when the inlet openings 212, 222A, 206A of the package cover 208, the sealing material layer 222, and the cold plate 206, respectively, are located on the left-hand side of the device package 201 and the outlet openings 212, 222A, 206A of the package cover 208, the sealing material layer 222, and the cold plate 206, respectively, are located on the right-hand side of the device package 201. Alternatively, the coolant fluid may flow from right to left in the device package 201 illustrated in FIG. 3 when the outlet openings 212, 222A, 206A of the package cover 208, the sealing material layer 222, and the cold plate 206 are located on the left-hand side of the device package 201 and the inlet openings 212, 222A, 206A of the package cover 208, the sealing material layer 222, and the cold plate 206 are located on the right-hand side of the device package 201. Although only one set of inlet and outlet openings is shown and described here, additional inlet and outlet openings may also be provided at various locations on the package cover 208, the sealing material layer 222, and the cold plate 206.

An example flow path of the coolant fluid through the coolant chamber volume 210 may be as follows:
1. Coolant fluid enters the coolant chamber volume 210 through the inlet openings.
2. Coolant fluid flows across the inside surfaces of the cold plate 206 and absorbs heat generated by the semiconductor device 204, which has dissipated into the cold plate 206 structure. The coolant fluid may also flow directly across the backside 220 of the semiconductor device 204 to absorb heat energy directly from the semiconductor device 204. The coolant chamber volume 210 may additionally have various channels formed to direct the coolant fluid flow from inlet opening(s) to outlet opening(s) and facilitate heat extraction from the semiconductor device 204 by the coolant fluid. In some embodiments, the coolant fluid may be in direct contact with the backside 220 of the semiconductor device 204 or via one or more substrate or layers between the coolant fluid or backside 220 of the semiconductor device 204.

3. Coolant fluid exits the coolant chamber volume 210 through outlet openings.

It will be understood from the above flow path that heat is extracted without introducing an unnecessary thermal resistance (e.g., a TIM disposed between the backside 220 of the semiconductor device 204 and the cold plate 206) between the backside 220 of the semiconductor device 204 and the cold plate 206.

Figure 5:
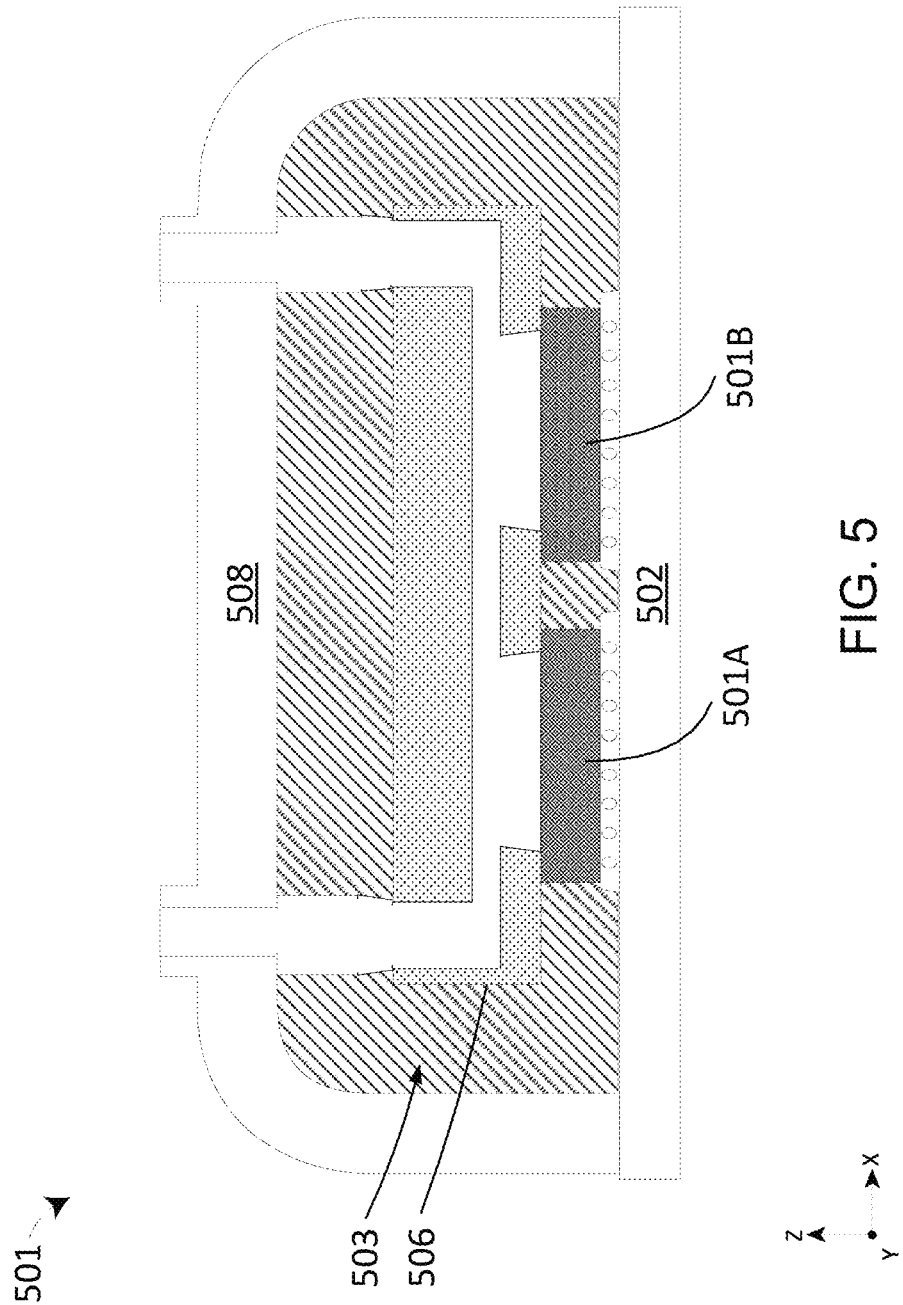
FIG. 5 is a schematic sectional view of another example device package that may be used with the system panel, in accordance with some embodiments of the present disclosure.

FIG. 5 is a schematic side sectional view in the X-Z plane of an example of a multi-component device package 501 that includes a cold plate 506 directly bonded to the backside surfaces of two or more devices 501A, 501B. The multi-component device package 501 may be similar to the device package 201 described above, and therefore the description of similar features is omitted for brevity. In some embodiments, the two or more devices 501A and 501B are reconstituted and then bonded to the cold plate 506. As shown, the device package 501 includes a package substrate 502, an integrated cooling assembly 503 and a package cover 508.

The integrated cooling assembly 503 may include a plurality of devices 501A (one shown), that may be singulated and/or disposed in a vertical device stack (e.g., device 501B). The cold plate 506 may be attached to each of the devices 501A and device stack 501B (e.g., by the direct bonding methods described herein or other methods including flip chip bonding, etc.). In some embodiments, the device 501A may comprise a processor and the device stack 501B may comprise a plurality of memory devices. Here, the device 501A and the device stack 501B are disposed in a side-by-side arrangement on the package substrate 502 and are in electrical communication with one another through conductive elements formed in, on, or through the package substrate 502. Here, the cold plate 506 is sized to provide a bonding surface for attachment to both the device 501A and the device stack 501B but may otherwise be the same or substantially similar to other cold plates described herein.

In some embodiments, the lateral dimensions (or footprint) of the cold plate 506 may be the same or larger than the combined lateral dimensions (or footprint) of both the device 501A and the device stack 501B. In some embodiments, one or more sidewalls of the cold plate 506 may extend past the vertical sidewalls of the device 501A and the device stack 501B. In some embodiments, more than one cold plate 506 may be bonded. For example, separate cold plates may be bonded to the device 501A and the device stack 501B. In some embodiments, the footprint of the cold plate 506 may be larger or the same size in one or both directions when compared to the combined footprint of both the device 501A and the device stack 501B. In some embodiments, the inlet and outlet openings in the cold plate are outside of the footprints of both the device 501A and the device stack 501B.

Figure 6:
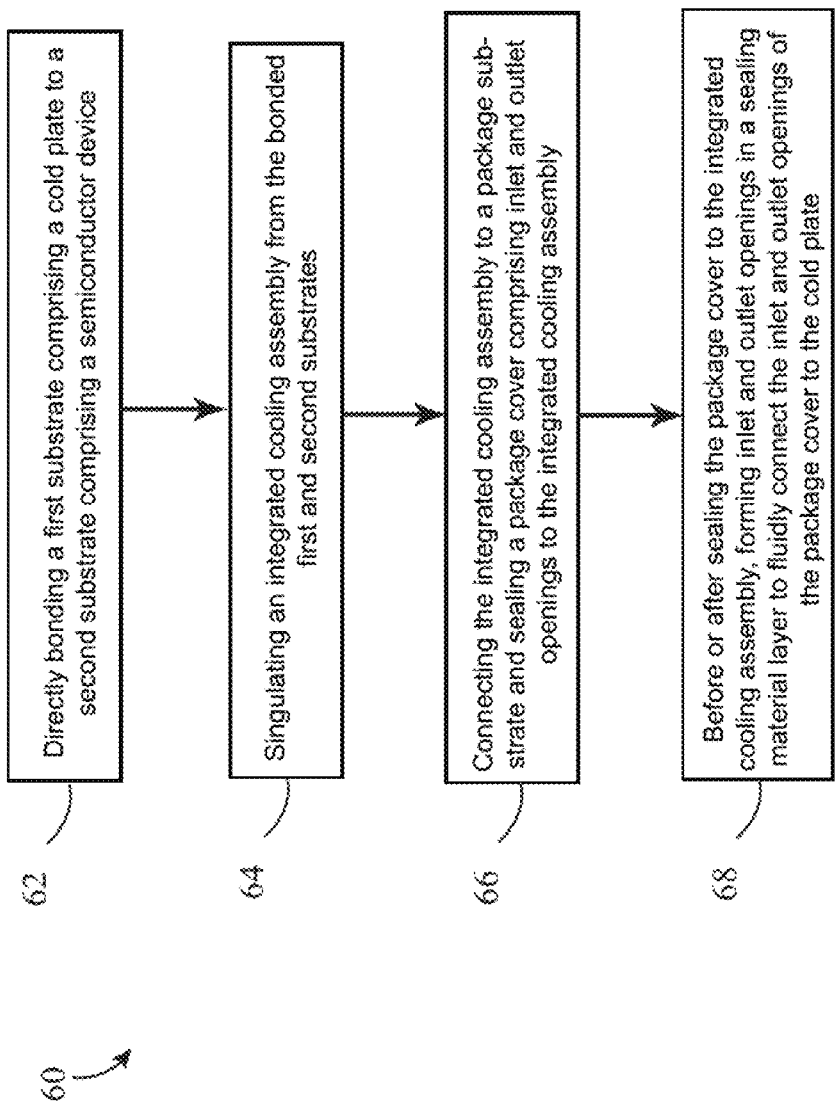
FIG. 6 shows a method that can be used to manufacture the device package, in accordance with some embodiments of the present disclosure.

FIG. 6 is a flow diagram showing a method 60 of forming an integrated cooling assembly, according to embodiments of the present disclosure. Generally, the method 60 includes bonding a first substrate comprising one or more cold plates 206 to a second substrate comprising one or more semiconductor devices 204, and singulating one or more integrated cooling assemblies 203 from the bonded first and second substrates. For example, a wafer (bare or reconstituted wafer) comprising one or more cold plates 206 can be directly bonded to another wafer (bare or reconstituted wafer) comprising one or more semiconductor devices 204.

It will be understood that the first substrate may be a cold plate die or part of a wafer of cold plates. Further, the second substrate may be a semiconductor device die or part of a wafer of semiconductor devices 204. Therefore, the method 60 may include die-to-die direct bonding (e.g., cold plate die to semiconductor device die), water-to-die direct bonding (e.g., cold plate die to semiconductor device wafer, or cold plate wafer to semiconductor device die), and wafer-to-wafer direct bonding (e.g., cold plate wafer to semiconductor device wafer). It will be understood that the singulation step (discussed in relation to block 64, below) may not be required for a die-to-die direct bonding operation.

For simplicity, the following description is focused on forming one integrated cooling assembly 203 comprising one cold plate 206 and one semiconductor device 204. However, as mentioned above, in some embodiments, the first substrate may comprise plural cold plates 206 and the second substrate may comprise plural semiconductor devices 204, such that plural integrated cooling assemblies 203 may be formed from the first and second substrates.

At block 62, the method 60 includes directly bonding the first substrate (e.g., a monocrystalline silicon wafer) comprising a cold plate 206 to the second substrate (e.g., a monocrystalline silicon wafer) comprising a semiconductor device 204 without an intervening adhesive. In some embodiments, the cold plate 206 may be directly bonded to the backside of the semiconductor device 204.

In some embodiments, the first substrate may be etched using a patterned mask layer formed on its surface to form features of the cold plate 206. An anisotropic etch process may be used, which uses inherently differing etch rates for the silicon material as between {100} plane surfaces and {111} plane surfaces when exposed to an anisotropic etchant.

In some embodiments, the etching process is controlled to where the etch rates of the substrate surfaces have a ratio between about 1:10 and about 1:200, such as between about 1:10 and about 1:100, for example between about 1:10 and 1:50, or between about 1:25 and 1:75. Examples of suitable anisotropic wet etchants include aqueous solutions of potassium hydroxide (KOH), ethylene diamine and pyrocatechol (EPD), ammonium hydroxide ($HN_4OH$), hydrazine ($N_2H_4$), or tetra methyl ammonium hydroxide (TMAH). The actual etch rates of the silicon substrate depend on the concentration of the etchant in the aqueous solution, the temperature of the aqueous solution, and a concentration of the dopant in the substrate (if any). Typically, the mask layer is formed of a material that is selective to anisotropic etch compared to the underlying monocrystalline silicon substrate. Examples of suitable mask materials include silicon oxide ($Si_xO_y$) or silicon nitride ($Si_xN_y$). In some embodiments, the mask layer has a thickness of about 100 nm or less, such as about 50 nm or less, or about 30 nm or less. The mask layer may be patterned using any suitable combination of lithography and material etching patterning methods.

The second substrate may include a bulk material, and a plurality of material layers disposed on the bulk material. The bulk material may include any semiconductor material suitable for manufacturing semiconductor devices, such as silicon, silicon carbide, silicon germanium, germanium, group III-V semiconductor materials, group II-VI semiconductor materials, or combinations thereof. While some high-performance processors like CPUs, GPUs, neural processing units (NPUs), and tensor processing units (TPUs) are typically made out of silicon, some other high-power density (hence substantial heat-generating) devices may comprise silicon carbide or gallium nitride, for example. In some embodiments, the second substrate may include a monocrystalline wafer, such as a silicon wafer, a plurality of device components formed in or on the silicon wafer, and a plurality of interconnect layers formed over the plurality of device components. In other embodiments, the second substrate may comprise a reconstituted substrate (e.g., a substrate formed from a plurality of singulated devices embedded in a support material). In some embodiments, each semiconductor device may have its own individual cold plate fabricated through a reconstitution process.

The bulk material of the second substrate may be thinned after the semiconductor device 204 is formed using one or more backgrinding, etching, and polishing operations that remove material from the backside. Thinning the second substrate may include using a combination of grinding and etching processes to reduce the thickness (in the Z-direction) to about 450 μm or less, such as about 200 μm or less, or about 150 μm or less or about 50 μm or less. After thinning, the backside 220 may be polished to a desired smoothness using a chemical mechanical polishing (CMP) process, and the dielectric material layer may be deposited thereon. In some embodiments, the dielectric material layer may be polished to a desired smoothness to prepare the second substrate for the bonding process. In some embodiments, the method 60 includes forming a plurality of metal features in the dielectric material layer in preparation for a hybrid bonding process, such as by use of a damascene process.

In some embodiments, the active side of the second substrate is temporarily bonded to a carrier substrate (not shown) before or after the thinning process. When used, the carrier substrate provides support for the thinning operation and/or for the thinned material to facilitate substrate handling during one or more of the subsequent manufacturing operations described herein.

Here, the method 60 may include forming dielectric layers on one or both the first and second substrates, and directly bonding includes forming dielectric bonds between a first dielectric material layer of the first substrate and a second dielectric material layer of the second substrate (or forming dielectric bonds between one substrate and a dielectric material layer of the other substrate). Direct bonding processes join dielectric layers by forming strong chemical bonds (e.g., covalent bonds) between the dielectric layers.

Generally, directly bonding the surfaces (of the dielectric material layers formed on the first and second substrates) includes preparing, aligning, and contacting the surfaces. Examples of dielectric material layers include silicon oxide, silicon nitride, silicon oxynitride, and silicon carbonitride. Preparing the surfaces may include smoothing the respective surfaces to a desired surface roughness, such as between 0.1 to 3.0 nm RMS, activating the surfaces to weaken or open chemical bonds in the dielectric material, and terminating the surfaces with a desired species. Smoothing the surfaces may include polishing the first and second substrates using a CMP process. Activating and terminating the surfaces with a desired species may include exposing the surfaces to radical species formed in a plasma. The bond interface between the bonded dielectric layers can include a higher concentration of materials from the activation and/or last chemical treatment processes compared to the bulk of the bonding layers. For example, in some embodiments that utilize a nitrogen plasma for activation, a nitrogen concentration peak can be formed at the bond interface. In some embodiments, the nitrogen concentration peak may be detectable using secondary ion mass spectroscopy (SIMS) techniques. In various embodiments, for example, a nitrogen termination treatment (e.g., exposing the bonding surface to a nitrogen-containing plasma) can replace OH groups of a hydrolyzed (OH-terminated) surface with $NH_2$ molecules, yielding a nitrogen-terminated surface. In embodiments that utilize an oxygen plasma for activation, an oxygen concentration peak can be formed at the bond interface between non-conductive bonding surfaces.

In some embodiments, the plasma is formed using a nitrogen-containing gas (e.g., $N_2$), and the terminating species includes nitrogen, or nitrogen and hydrogen. In some embodiments, fluorine may also be present within the plasma. In some embodiments, the surfaces may be activated using a wet cleaning process (e.g., by exposing the surfaces to an aqueous ammonia solution). In some embodiments, the dielectric bonds may be formed using a dielectric material layer deposited on only one of the first and second substrates, but not on both. In those embodiments, the direct dielectric bonds may be formed by contacting the deposited dielectric material layer of one of the first and second substrates directly with a bulk material surface (or such a surface with a native oxide) of the other substrate.

Directly forming direct dielectric bonds between the first and second substrates at block 62 may include bringing the prepared and aligned surfaces into direct contact at a temperature less than 150° C., such as less than 100° C., for example, less than 30° C., or about room temperature, e.g., between 20° C. and 30° C. Without intending to be bound by theory, in the case of directly bonding surfaces terminated with nitrogen and hydrogen (e.g., $NH_2$ groups), it is believed that the hydrogen terminating species diffuse from the interfacial bonding surfaces, and chemical bonds are formed between the remaining nitrogen species during the direct bonding process. In some embodiments, the direct bond is strengthened using an anneal process, where the substrates are heated to and maintained at a temperature of greater than about 30° C. and less than about 450° C., for example, greater than about 50° C. and less than about 250° C., or about 150° C., for a duration of about 5 minutes or more, such as about 15 minutes. Typically, the bonds will strengthen over time even without the application of heat. Thus, in some embodiments, the method does not include heating the substrates.

In embodiments where the first and second substrates are bonded using hybrid dielectric and metal bonds, the method 60 may further include planarizing or recessing the metal features below the dielectric field surface before contacting and bonding the dielectric material layers. After the dielectric bonds are formed, the first and second substrates may be heated to a temperature of 150° C. or more and maintained at the elevated temperature for a duration of about 1 hour or more (e.g., between 8 and 24 hours) to form direct metallurgical bonds between the metal features.

Suitable direct dielectric and hybrid bonding technologies that may be used to perform aspects of the methods described herein include ZiBond® and DBI®, each of which are commercially available from Adeia Holding Corp., San Jose, CA, USA.

At block 64, the method 60 includes singulating at least one integrated cooling assembly 203 from the bonded first and second substrates. Singulation after bonding may impart distinctive structural characteristics on the integrated cooling assembly 203 as the bonding surface of the cold plate 206 may have a different perimeter than the backside of the semiconductor device 204 bonded thereto. In some embodiments, the sidewalls (e.g., side surfaces) of the cold plate 206 may extend past the edges (e.g., side surfaces) of the semiconductor device 204. In some embodiments, the cold plate 206 is singulated from the first substrate using a process that cuts or divides the first substrate in a vertical plane (i.e., in the Z-direction). In those embodiments, the side surfaces of the cold plate 206 are substantially perpendicular to the backside 220 of the semiconductor device 204 (i.e., a horizontal (X-Y) plane of an attachment interface between the semiconductor device 204 and the cold plate 206). In some embodiments, the cold plate 206 is singulated using a saw or laser dicing process.

At block 66, the method 60 may include connecting the integrated cooling assembly 203 to the package substrate 202 and sealing a package cover 208 comprising inlet and outlet openings 212 to the integrated cooling assembly 203 by use of a molding compound that, when cured, forms a sealing material layer 222.

At block 68, the method 60 may include, before or after sealing the package cover 208 to the integrated cooling assembly 203, forming inlet and outlet openings 222A in the sealing material layer 222 to fluidly connect the inlet and outlet openings 212 of the package cover 208 to the cold plate 206.

Figure 7:
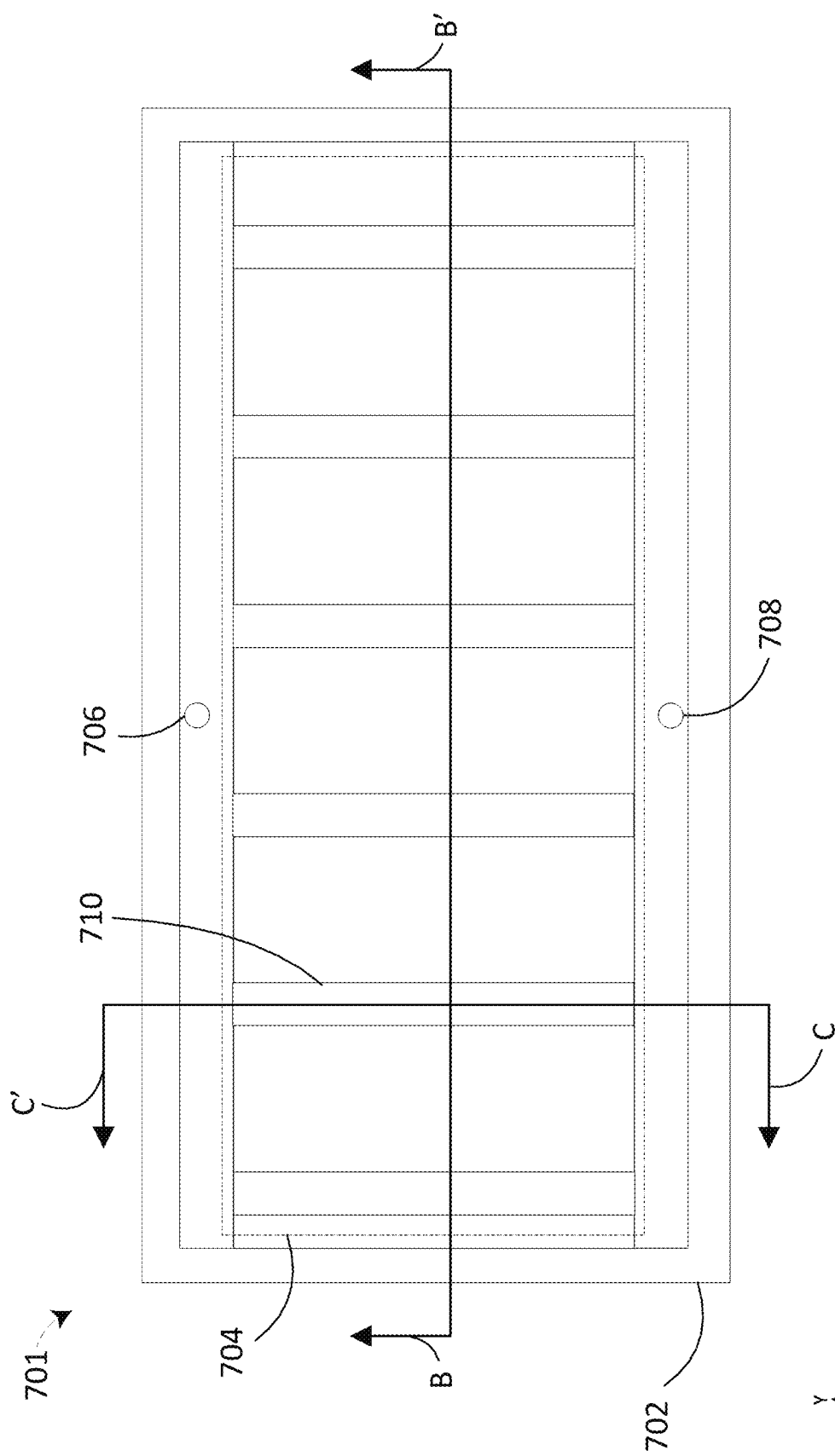
FIG. 7 shows schematic views of a portion of a device package that may be used with the system panel, in accordance with some embodiments of the present disclosure.

FIG. 7 shows a schematic top view of a portion of a device package 701 that may be used with a system panel, in accordance with some embodiments of the present disclosure. The portion of a device package 701 may be the same or similar to portions of the device package 201 described above, and therefore the description of similar features is omitted for brevity. In some embodiments, the portion of a device package 701 comprises a cold plate 702 bonded to a first device 704. Only the outline of the first device 704 is shown in FIG. 7 because the first device 704 is located under the cold plate 702. In some embodiments, the cold plate 702 comprises a first region, a second region, and a third region, wherein the second region is between the first region and the third region. In some embodiments, the cold plate 702 is bonded to the first device 704 via the first region and the third region.

In some embodiments, the cold plate 702 comprises an inlet 706, an outlet 708, and a plurality of coolant channels (e.g., a first coolant channel 710). Although six coolant channels are shown, the cold plate 702 may comprise more or fewer coolant channels. Similarly, although one inlet 706 and one outlet 708 are shown, the cold plate 702 may comprise more or fewer inlets and/or outlets. In some embodiments, one or more coolant channels of the plurality of coolant channels (e.g., the first coolant channel 710) extend along the second region of the cold plate 702.

In some embodiments, the lateral dimensions (or footprint) of the cold plate 702 are larger than the lateral dimensions (or footprint) of the first device 704. For example, one or more edges of the cold plate 702 may extend past the edges of the device 704. In some embodiments, the cold plate 702 having a larger footprint than the footprint of the device 704 allows for more coolant to flow underneath more of the surface area of the device 704 resulting in more heat being dissipated from the device 704.

In some embodiments, the inlet 706 and outlet 708 are outside of the footprint of the first device 704. The inlet 706 and outlet allow coolant to flow through the plurality of coolant channels (e.g., the first coolant channel 710). In some embodiments, the inlet 706 and outlet 708 of the cold plate 702 are located outside the footprint of the first device 704. In some embodiments, having the inlet 706 and outlet 708 of the cold plate 702 located outside the footprint of the first device 704 allows for a reduction in stagnant coolant flows forming around the inlet and outlet regions, resulting in increased heat dissipation and decreased temperatures for the device 704.

Figure 8:
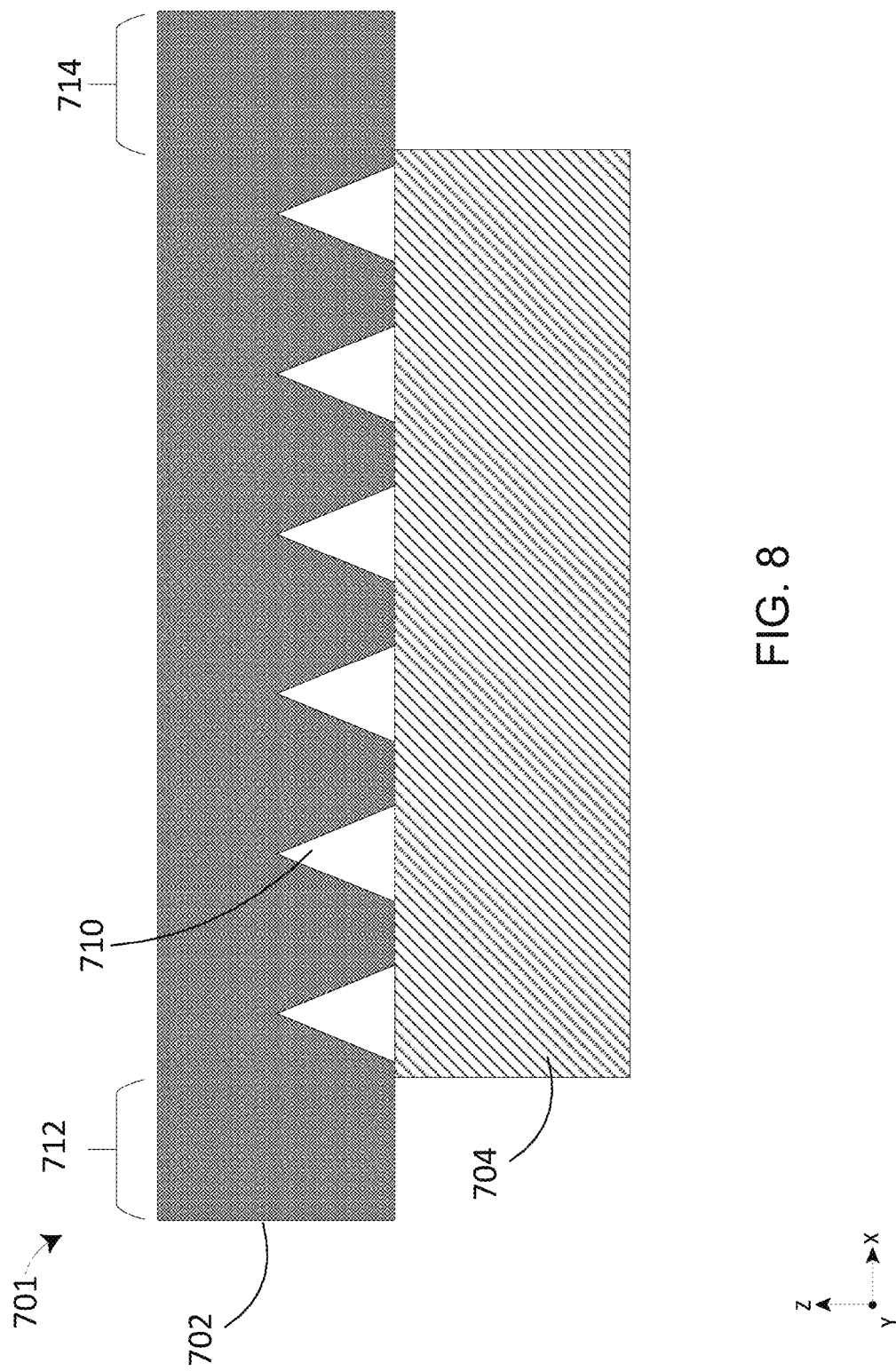
FIG. 8 shows schematic views of a portion of a device package that may be used with the system panel, in accordance with some embodiments of the present disclosure.

FIG. 8 is a schematic sectional view in the X-Z plane of the portion of the device package 701 taken along line B-B' of FIG. 7. The portion of a device package 701 may be the same or similar to portions of the device package 201 described above, and therefore the description of similar features is omitted for brevity. As described above, the portion of a device package 701 comprises the cold plate 702 bonded to the first device 704. The cold plate 702 comprises an inlet (not shown in FIG. 8), an outlet (not shown in FIG. 8), and a plurality of coolant channels (e.g., first coolant channel 710).

In some embodiments, a first portion 712 of the cold plate 702 and a second portion 714 of the cold plate 702 extend past one or more edges of the device 704 in the X-axis direction. In some embodiments, the first portion 712 and the second portion 714 of the cold plate 702 extending past one or more edges of the device 704 in the X-axis direction allows for increased heat dissipation.

Figure 9:
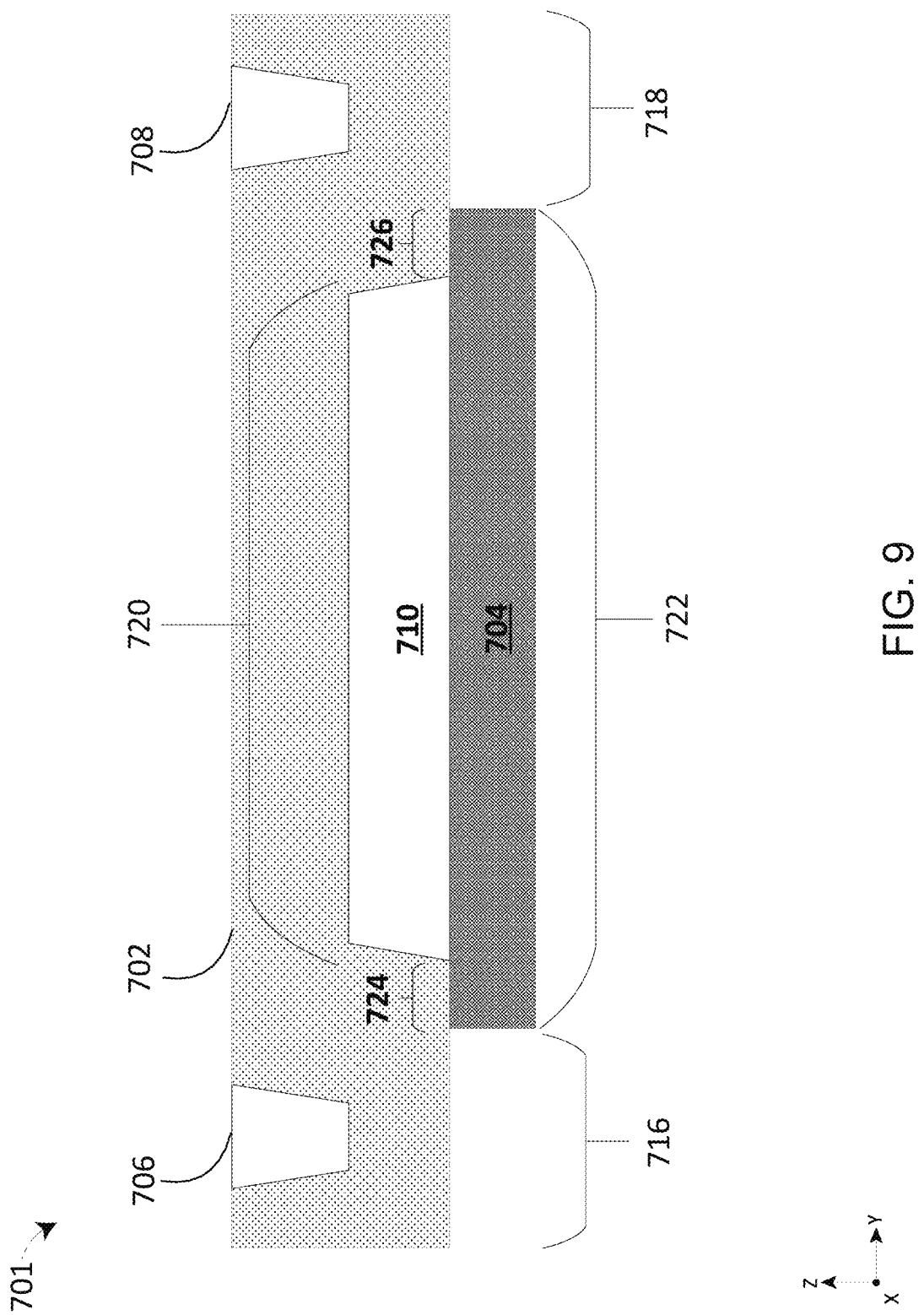
FIG. 9 shows heat maps related to a portion of a device package that may be used with the system panel, in accordance with some embodiments of the present disclosure.

FIG. 9 is a schematic sectional view in the X-Y plane of the portion of the device package 701 taken along line C-C' of FIG. 7. The portion of a device package 701 may be the same or similar to portions of the device package 201 described above, and therefore the description of similar features is omitted for brevity. As described above, the portion of a device package 701 comprises the cold plate 702 bonded to the first device 704. The cold plate 702 comprises an inlet 706, an outlet 708, and a plurality of coolant channels (e.g., first coolant channel 710).

In some embodiments, a third portion 716 of the cold plate 702 and a fourth portion 718 of the cold plate 702 extend past one or more edges of the device 704 in the Y-axis direction. In some embodiments, the third portion 716 and the fourth portion 718 of the cold plate 702 extending past one or more edges of the device 704 in the Y-axis direction allows for increased heat dissipation.

As shown, the inlet 706 and outlet 708 are outside of the footprint of the first device 704 in the Y-axis direction. The inlet 706 and outlet allow coolant to flow through the plurality of coolant channels (e.g., the first coolant channel 710). For example, coolant may flow from one or more coolant lines (e.g., coolant line 108) into the inlet 706. The coolant may then flow from the inlet 706 into the first coolant channel 710. The coolant may then flow from the first coolant channel 710 to the outlet 708 and exit the cold plate 702. In some embodiments, coolant flowing through the first coolant channel 710 directly contacts the backside of the device 704. In some embodiments, the direct contact between coolant flowing through the first coolant channel 710 and the backside of the device 704 results in increased thermal dissipation and a decrease in temperature of the device 704.

In some embodiments, the inlet 706 and outlet 708 of the cold plate 702 are located outside the footprint of the first device 704 in the Y-axis direction. In some embodiments, having the inlet 706 and outlet 708 of the cold plate 702 located outside the footprint of the first device 704 allows for a reduction in stagnant coolant flows forming around the inlet region (e.g., third portion of 716 of the cold plate 702) and/or outlet region (e.g., fourth portion 718 of the cold plate 702), resulting in increased heat dissipation and decreased temperatures for the device 704.

In some embodiments, the length of one or more coolant channels (e.g., first coolant channel 710) that extends along the backside of the device 704 in the Y-axis direction is less than the length of the backside of the device 704 in the Y-axis direction. For example, the first coolant channel 710 may have a first length 720 in the Y-axis direction and the backside of the device 704 may have a second length 722 in the Y-axis direction. The difference between the first length 720 and the second length 722 may be the amount of cold plate material needed to provide adequate adhesion between the cold plate 702 and the device 704. For example, the cold plate 702 may be attached to the device 704 by bonding a first portion of cold plate material 724 and a second portion of cold plate material 726 with the device 704. In some embodiments, the first length 720 may be between 50 micrometers to 1 millimeter less than the second length 722 to provide adequate adhesion between the cold plate 702 and the device 704.

Figure 10:
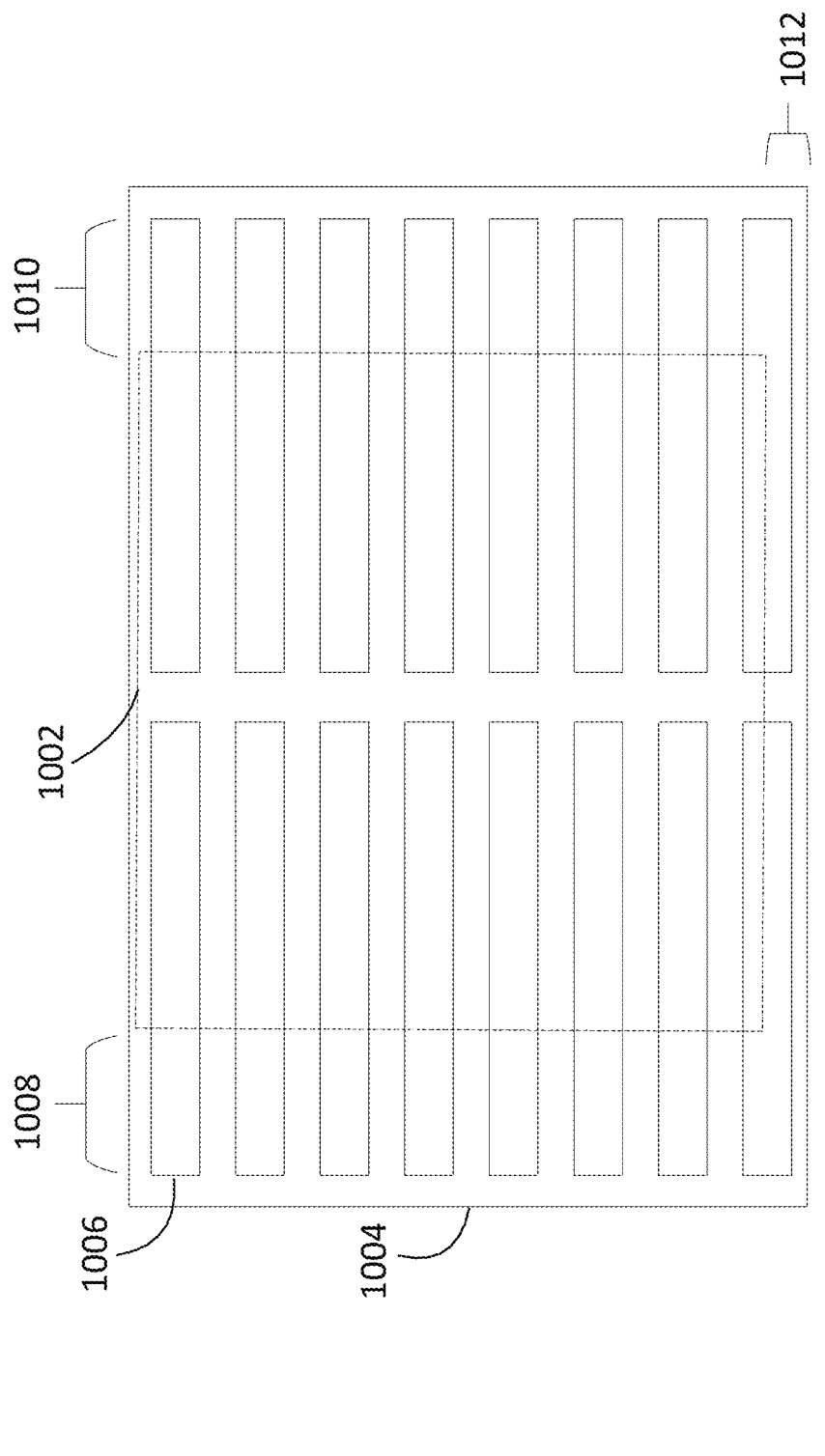
FIG. 10 shows schematic top views of a portion of a device package that may be used with the system panel, in accordance with some embodiments of the present disclosure.
Figure 11:
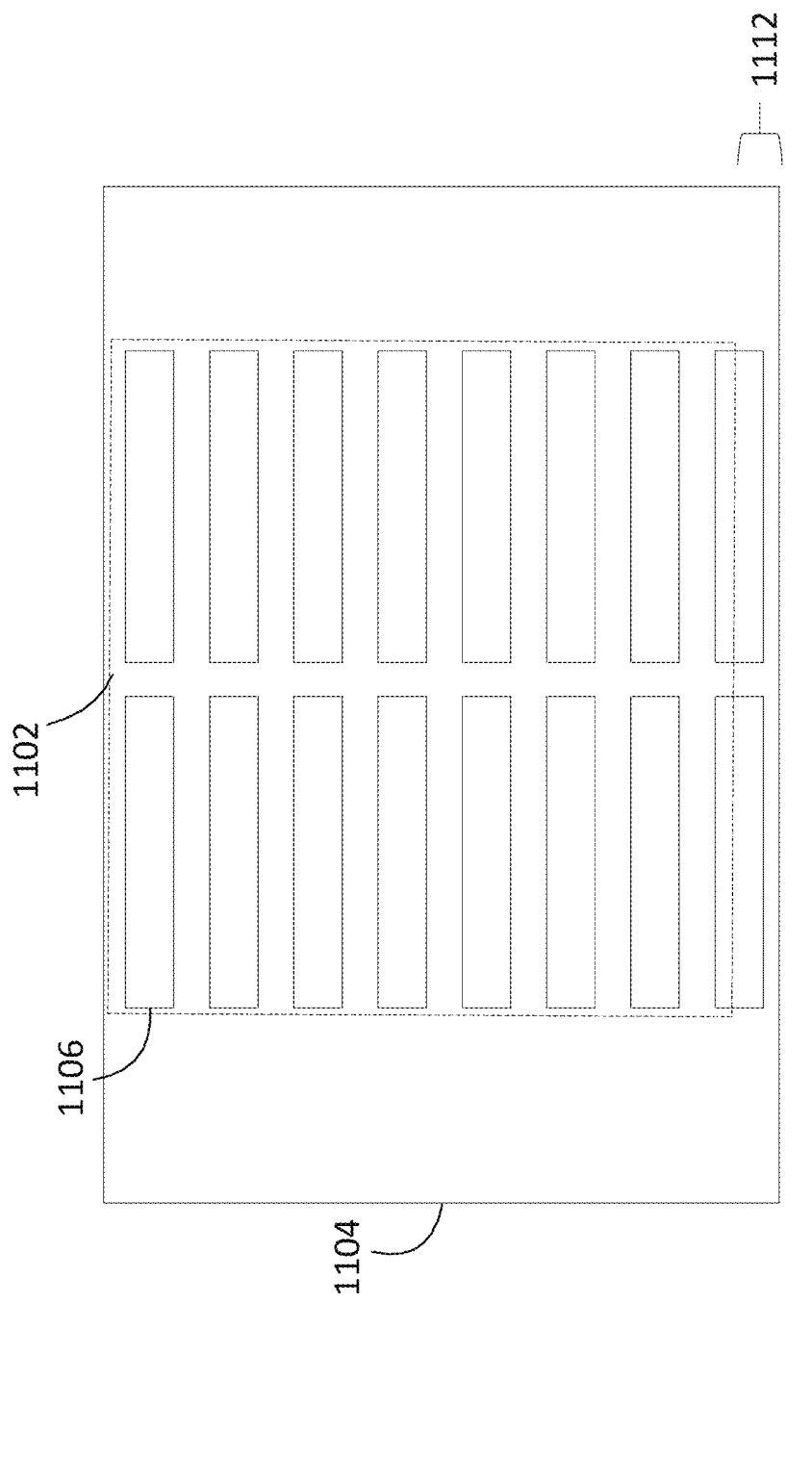
FIG. 11 shows schematic views of a portion of a device package that may be used with the system panel, in accordance with some embodiments of the present disclosure.

FIG. 10-11 show schematic top views of portion of a device package that were used in experimentations to test one or more aspects of the invention described herein. FIG. 10 displays a cold plate 1002, a plurality of resistors (e.g., a first resistor 1006), and a substrate 1004. In some embodiments, the plurality of resistors are bonded to the substrate 1004 and the cold plate 1002 is attached to the plurality of resistors. As shown, the footprint of the cold plate 1002 is smaller than the footprint of the plurality of resistors. For example, a first portion 1008 of the plurality of resistors and a second portion 1010 of the plurality of resistors extend past one or more edges of the cold plate 1002 in the X-axis direction and a third portion 1012 of the plurality of resistors extend past one or more edges of the cold plate 1002 in the Y-axis direction. Temperature measurements were recorded during operations of the portion of a device package displayed in FIG. 10. Temperature measurements recorded for the first portion 1008, second portion 1010, and third portion 1012 of the plurality of resistors were much higher than temperature measurements recorded for portions of the plurality of resistors located within the footprint of the cold plate 1002.

FIG. 11 displays a cold plate 1102, a plurality of resistors (e.g., a first resistor 1106), and a substrate 1104. In some embodiments, the plurality of resistors are bonded to the substrate 1104 and the cold plate 1102 is attached to the plurality of resistors. As shown, the footprint of the cold plate 1102 is the same or similar to the footprint of the plurality of resistors in the X-axis direction but is smaller than the footprint of the plurality of resistors in the Y-axis direction. For example, a first portion 1112 of the plurality of resistors extend past one or more edges of the cold plate 1102 in the Y-axis direction. Temperature measurements were recorded during operations of the portion of a device package displayed in FIG. 11. Temperature measurements recorded for the first portion 1112 of the plurality of resistors were much higher than temperature measurements recorded for portions of the plurality of resistors located within the footprint of the cold plate 1102. Accordingly, the portion of a device package displayed in FIG. 11 experienced overall decreased temperatures compared to the portion of a device package displayed in FIG. 10. This result is caused, at least in part, on less portions of the plurality of resistors extending past the footprint of the cold plate.

The embodiments discussed above are intended to be illustrative and not limiting. One skilled in the art would appreciate that individual aspects of the cooling assemblies, device packages, and methods discussed herein may be omitted, modified, combined, and/or rearranged without departing from the scope of the disclosure.

What is claimed is:

1. A device package comprising:
an integrated cooling assembly comprising a semiconductor device with a first footprint and a cold plate attached to the semiconductor device, wherein:
the cold plate has a second footprint larger than the first footprint;
the cold plate comprises a first side, a second side vertically adjacent to the first side, a first inlet, a first coolant channel, and a first outlet;
the first inlet and the first outlet are outside of the first footprint of the semiconductor device;
the first side of the cold plate comprises a first region, a second region, and a third region, wherein the second region is between the first region and the third region;
the semiconductor device is directly contacting the cold plate and is attached to the first region of the cold plate and the third region of the cold plate; and
a portion of the first coolant channel extends along the second region of the cold plate.

2. The device package of claim 1, wherein:
the first inlet is coupled to a first coolant line;
the first coolant channel extends along the semiconductor device; and
coolant is disposed in the first coolant channel and directly contacts the semiconductor device.

3. The device package of claim 1, wherein:
the first inlet is coupled to a first coolant line;
the first coolant channel extends along the semiconductor device; and
coolant flows from the first inlet through the first coolant channel and directly contacts the semiconductor device.

4. The device package of claim 1, wherein the cold plate is attached to the semiconductor device by direct dielectric bonds.

5. The device package of claim 1, wherein the cold plate is attached to the semiconductor device by direct hybrid bonds.

6. The device package of claim 1, wherein the semiconductor device is a device stack.

7. The device package of claim 1, wherein the integrated cooling assembly comprises an additional semiconductor device and the cold plate is attached to the semiconductor device and the additional semiconductor device.

8. The device package of claim 7, wherein the cold plate is attached to the semiconductor device and the additional semiconductor device by direct dielectric bonds.

9. The device package of claim 7, wherein the cold plate is attached to the semiconductor device and the additional semiconductor device by direct hybrid bonds.

10. The device package of claim 7, wherein:
the first inlet is coupled to a first coolant line;
the first coolant channel extends along the semiconductor device and the additional semiconductor device; and
coolant is disposed in the first coolant channel and directly contacts the semiconductor device and the additional semiconductor device.

11. The device package of claim 7, wherein:
the first inlet is coupled to a first coolant line;
the first coolant channel extends along the semiconductor device and the additional semiconductor device; and
coolant flows from the first inlet through the first coolant channel and directly contacts the semiconductor device and the additional semiconductor device.

12. The device package of claim 11, wherein:
the additional semiconductor device has a third footprint smaller than the second footprint.

13. The device package of claim 12, wherein the second footprint is larger than a combination of the first footprint and the third footprint.

14. The device package of claim 1, wherein the cold plate further comprises a second coolant channel.

15. The device package of claim 14, wherein:

the first inlet is coupled to a first coolant line;

the first coolant channel extends along the semiconductor device;

the second coolant channel extends along the semiconductor device;

coolant flows from the first inlet through the first coolant channel and the second coolant channel;

coolant flowing through the first coolant channel directly contacts the semiconductor device; and coolant flowing through the second coolant channel directly contacts the semiconductor device.

16. The device package of claim 14, wherein:

the first inlet is coupled to a first coolant line;

the first coolant channel extends along the semiconductor device;

the second coolant channel extends along the semiconductor device;

coolant is disposed in the first coolant channel and the second coolant channel, and directly contacts the semiconductor device.

17. The device package of claim 1, wherein:

a portion of the first coolant channel that extends along the semiconductor device in a first direction has a first length; and the semiconductor device has a second length in the first direction.

* * * * *